(12) United States Patent
Suzuki et al.

(10) Patent No.: US 9,391,157 B2
(45) Date of Patent: Jul. 12, 2016

(54) SEMICONDUCTOR TRANSISTOR DEVICE

(71) Applicant: SEMICONDUCTOR ENERGY LABORATORY CO., LTD., Atsugi-shi, Kanagawa-ken (JP)

(72) Inventors: Yasutaka Suzuki, Kanagawa (JP); Yuki Hata, Kanagawa (JP); Yoshinori Ieda, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/474,450

(22) Filed: Sep. 2, 2014

(65) Prior Publication Data
US 2015/0069383 A1 Mar. 12, 2015

(30) Foreign Application Priority Data
Sep. 6, 2013 (JP) .................. 2013-184560

(51) Int. Cl.
*H01L 29/12* (2006.01)
*H01L 29/51* (2006.01)
*H01L 29/786* (2006.01)
*H01L 27/12* (2006.01)

(52) U.S. Cl.
CPC ............ *H01L 29/51* (2013.01); *H01L 27/1225* (2013.01); *H01L 29/7869* (2013.01); *H01L 29/78606* (2013.01); *H01L 29/78648* (2013.01)

(58) Field of Classification Search
CPC ............ H01L 29/7869; H01L 27/124; H01L 27/1225; H01L 51/56
USPC ............ 257/350, 59, 72, E21.411, E27.111, 257/E29.151, E29.295
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Mary Wilczewski
*Assistant Examiner* — Tsz Chiu
(74) *Attorney, Agent, or Firm* — Fish & Richardson P.C.

(57) ABSTRACT

A semiconductor device including an oxide semiconductor that is miniaturized and has favorable electrical characteristics is provided. The semiconductor device includes an oxide semiconductor film and a blocking film; a source electrode and a drain electrode electrically connected to the oxide semiconductor film; a gate insulating film in contact with the oxide semiconductor film, the source electrode, and the drain electrode; and a gate electrode in contact with the gate insulating film. The blocking film contains the same material as the oxide semiconductor film, is on the same surface as the oxide semiconductor film, and has a higher conductivity than the oxide semiconductor film.

17 Claims, 21 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,620,659 B2* | 9/2003 | Emmma | H01L 27/1108 257/206 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,237,166 B2 | 8/2012 | Kumomi et al. | |
| 9,217,903 B2* | 12/2015 | Koyama | G02F 1/136286 |
| 9,236,385 B2* | 1/2016 | Yamazaki | H01L 27/10873 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1* | 3/2007 | Yabuta | H01L 29/7869 257/347 |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0065771 A1* | 3/2009 | Iwasaki | H01L 29/78618 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0155940 A1* | 6/2009 | Lee | H01L 29/7869 438/29 |
| 2009/0278122 A1 | 11/2009 | Hosono et al. | |
| 2009/0280600 A1 | 11/2009 | Hosono et al. | |
| 2010/0025679 A1* | 2/2010 | Yamazaki | H01L 29/7869 257/43 |
| 2010/0059751 A1* | 3/2010 | Takahashi | H01L 29/7869 257/57 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2014/0167041 A1 | 6/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase", ", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Techncial Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al: B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR TRANSISTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification, a semiconductor device generally means a device which can function by utilizing semiconductor characteristics. A display device, an electro-optical device, a semiconductor circuit, and an electric device may include a semiconductor device.

2. Description of the Related Art

Attention has been focused on a technique for forming a transistor using a semiconductor thin film formed over a substrate having an insulating surface (the transistor is also referred to as thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) is disclosed in Patent Document 1.

REFERENCE

Patent Document

[Patent Document 1] Japanese Published Patent Application No. 2006-165528

SUMMARY OF THE INVENTION

In accordance with an increase in the degree of integration of circuits, an opening is provided in an interlayer insulating film between elements and an electrode, a wiring, or the like is provided in the opening to electrically connect the elements in some cases. In the case where the element is a transistor including an oxide semiconductor film, an impurity such as hydrogen enters the oxide semiconductor film through the opening, and an oxygen vacancy and hydrogen in the oxide semiconductor film reduce the resistance of the oxide semiconductor film, which leads to poor electrical characteristics of the transistor.

In view of the above, an object of one embodiment of the present invention is to provide a highly reliable semiconductor device including an oxide semiconductor. Another object of one embodiment of the present invention is to provide a novel semiconductor device.

In addition, miniaturization of a transistor is essential for achieving high-speed operation, low power consumption, low costs, high integration, and the like of the transistor.

Thus, another object of one embodiment of the present invention is to provide a semiconductor device including an oxide semiconductor that is miniaturized and has favorable electrical characteristics.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention is a semiconductor device including an oxide semiconductor film and a blocking film; a source electrode and a drain electrode electrically connected to the oxide semiconductor film; a gate insulating film in contact with the oxide semiconductor film, the source electrode, and the drain electrode; and a gate electrode in contact with the gate insulating film. The blocking film contains the same material as the oxide semiconductor film, is on the same surface as the oxide semiconductor film, and has a higher conductivity than the oxide semiconductor film.

Another embodiment of the present invention is a semiconductor device including an oxide semiconductor film and a blocking film; a source electrode and a drain electrode electrically connected to the oxide semiconductor film; a gate insulating film in contact with the oxide semiconductor film, the source electrode, and the drain electrode; and a gate electrode in contact with the gate insulating film. The blocking film contains a material different from materials of the oxide semiconductor film, the source electrode, and the drain electrode, is on the same surface as the oxide semiconductor film, and has a higher conductivity than the oxide semiconductor film.

Any of the above structures further includes an insulating film below the oxide semiconductor film and the blocking film. An opening is in the insulating film. The blocking film is closer to the oxide semiconductor film than the opening is.

The above structure further includes a first transistor below the insulating film. The first transistor includes a substrate containing a semiconductor material and is electrically connected to the source electrode or the drain electrode through the opening.

With one embodiment of the present invention, since a blocking film has a function of preventing entry of an impurity such as hydrogen to an oxide semiconductor film from another layer, electrical characteristics of a semiconductor device can be prevented from being impaired. Therefore, a semiconductor device with high reliability can be provided. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1A:
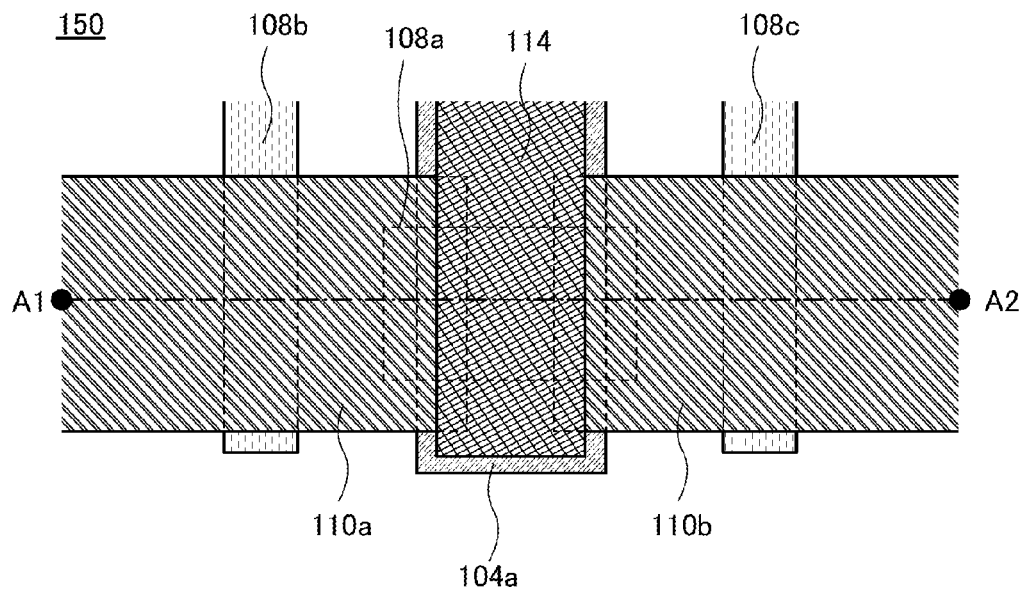
FIGS. 1A to 1C are a top view and cross-sectional views illustrating a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

(Embodiment 1)

In this embodiment, a semiconductor device of one embodiment of the present invention is described with reference to drawings.

Figure 1B:
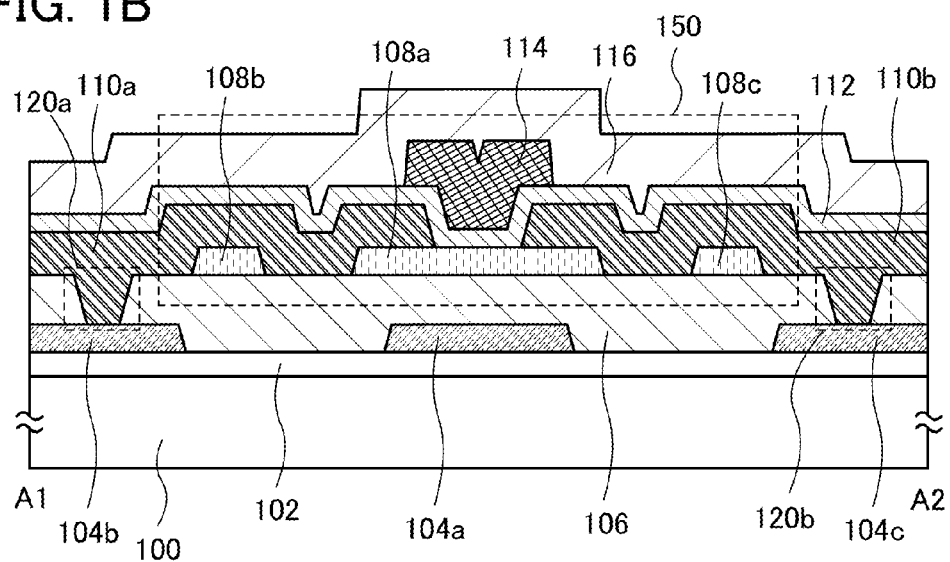
Figure 20:
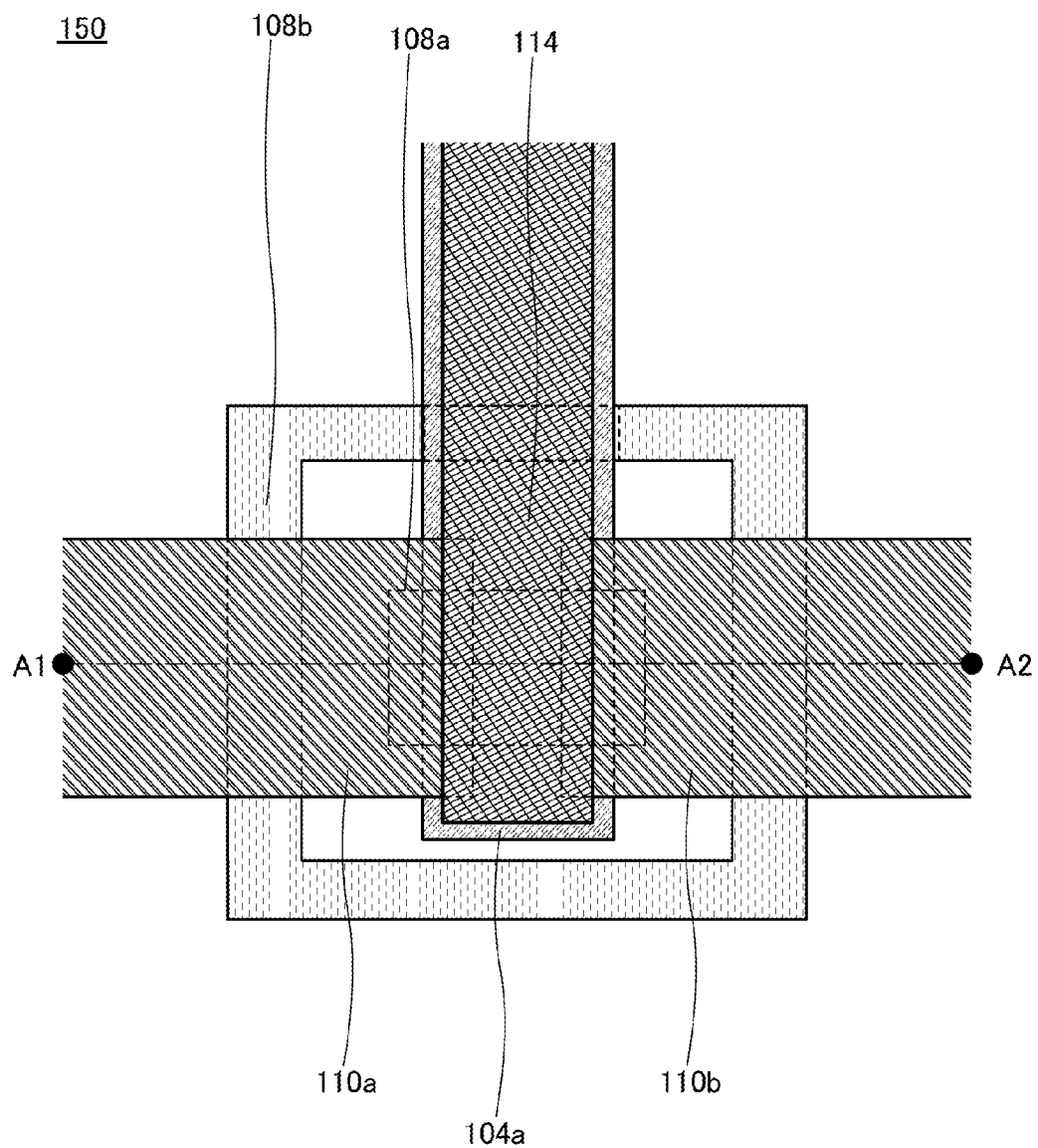
FIG. 20 is a top view illustrating a transistor.

FIGS. 1A and 1B are a top view and a cross-sectional view of a transistor of one embodiment of the present invention. FIG. 1A is the top view, and FIG. 1B illustrates a cross section taken along a dashed-dotted line A1-A2 in FIG. 1A. Note that for simplification of the drawing, some components are not illustrated in the top view in FIG. 1A. In some cases, the direction of the dashed-dotted line A1-A2 is referred to as a channel length direction, and the direction perpendicular to that of the dashed-dotted line A1-A2 is referred to as a channel width direction. Note that the top view is not limited to the example in FIG. 1A. FIG. 20 shows another example of the top view.

A transistor 150 in FIGS. 1A and 1B includes a base insulating film 102 over a substrate 100; a conductive film 104a, a conductive film 104b, and a conductive film 104c over the base insulating film 102; an interlayer insulating film 106 over the base insulating film 102 and the conductive films 104a, 104b, and 104c; an oxide semiconductor film 108a, a blocking film 108b, and a blocking film 108c over the interlayer insulating film 106; a source electrode 110a that is over the oxide semiconductor film 108a and the blocking film 108b and is electrically connected to the conductive film 104b through an opening 120a provided in the interlayer insulating film 106; a drain electrode 110b that is over the oxide semiconductor film 108a and the blocking film 108c and is electrically connected to the conductive film 104c through an opening 120b provided in the interlayer insulating film 106; a gate insulating film 112 over the oxide semiconductor film 108a, the source electrode 110a, and the drain electrode 110b; a gate electrode 114 that is over the gate insulating film 112 and overlaps with the oxide semiconductor film 108a; and an oxide insulating film 116 over the gate insulating film 112 and the gate electrode 114.

Note that a channel length refers to a distance between a source (a source region or a source electrode) and a drain (a drain region or a drain electrode) in a region where a semiconductor film and a gate electrode overlap with each other in a top view. Accordingly, in FIG. 1A, the channel length is a distance between the source electrode 110a and the drain electrode 110b in a region where the oxide semiconductor film 108a and the gate electrode 114 overlap with each other. A channel width refers to the width of a source or a drain in a region where a semiconductor film and a gate electrode overlap with each other. Accordingly, in FIG. 1A, the channel width is the width of the source electrode 110a or the drain electrode 110b in the region where the oxide semiconductor film 108a and the gate electrode 114 overlap with each other.

In fabricating a transistor with a small channel length and a small channel width, an electrode, a semiconductor film, or the like is processed while a resist mask is reduced in size and consequently has a round upper end portion (curved surface) in some cases. With this structure, the coverage with the gate insulating film 112, the gate electrode 114, and the oxide insulating film 116, which are to be formed over the oxide semiconductor film 108a, can be improved. In addition, electric field concentration which might occur at end portions of the source electrode 110a and the drain electrode 110b can be reduced, which can suppress deterioration of the transistor.

The blocking film 108b is closer to the oxide semiconductor film 108a than the opening 120a is. In other words, the distance between the blocking film 108b and the oxide semiconductor film 108a is shorter than the distance between the opening 120a and the oxide semiconductor film 108a. Similarly, the blocking film 108c is closer to the oxide semiconductor film 108a than the opening 120b is. In other words, the distance between the blocking film 108c and the oxide semiconductor film 108a is shorter than the distance between the opening 120b and the oxide semiconductor film 108a.

The blocking film in the above arrangement adsorbs an impurity such as hydrogen that enters from another layer (e.g., a layer between the transistor 150 and a silicon transistor) through the opening, and therefore has a function of preventing entry of the impurity to the oxide semiconductor film. Therefore, electrical characteristics of a semiconductor device can be prevented from being impaired.

In addition, the blocking film can be formed using the same material as the oxide semiconductor film on the same surface as the oxide semiconductor film. Thus, the blocking film can be formed without an increase in the number of manufacturing steps. Without being limited thereto, the blocking film can be formed using a material different from those of the oxide semiconductor film and the source electrode (or the drain electrode).

The blocking film adsorbs an impurity such as hydrogen and accordingly has a higher impurity concentration than that of the oxide semiconductor film. Therefore, the blocking film has higher conductivity than that of the oxide semiconductor film.

The oxide semiconductor film 108a can be electrically surrounded by an electric field of the gate electrode 114 (a structure in which an oxide semiconductor film is electrically surrounded by an electric field of a gate electrode is referred to as a surrounded channel (s-channel) structure). Therefore, a channel is formed in the entire oxide semiconductor film 108a (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

The substrate 100 is not limited to a simple support, and may be a substrate where an element such as a transistor or a capacitor is formed. In that case, at least one of the gate electrode, the source electrode, and the drain electrode of the transistor may be electrically connected to the above element.

The base insulating film 102 can have a function of supplying oxygen to the oxide semiconductor film 108a as well as a function of preventing diffusion of impurities from the substrate 100. Thus, the base insulating film 102 is preferably an insulating film containing oxygen. For example, an insulating film containing oxygen more than that in the stoichiometric composition is more preferable. Note that in the case where the substrate 100 is a substrate where an element is formed as described above, the base insulating film 102 has also a function as an interlayer insulating film. In that case, a surface of the base insulating film 102 may be planarized. For example, the base insulating film 102 may be subjected to planarization treatment such as chemical mechanical polishing (CMP) treatment.

The conductive film 104a can be used as a second gate electrode, whereby the on-state current can be further increased or the threshold voltage can be controlled. In order to increase the on-state current, the conductive film 104a and the gate electrode 114 are electrically connected to each other to have the same potential, and the transistor is driven as a dual-gate transistor. Alternatively, to control the threshold voltage, the conductive film 104a and the gate electrode 114 are not electrically connected to each other, so that a fixed potential, which is different from a potential of the gate electrode 114, is supplied to the conductive film 104a.

The conductive film 104b functions as a wiring electrically connected to the source electrode 110a, and the conductive film 104c functions as a wiring electrically connected to the drain electrode 110b. The conductive films 104b and 104c may be electrically connected to an element such as a transistor or a capacitor.

Figure 21A:
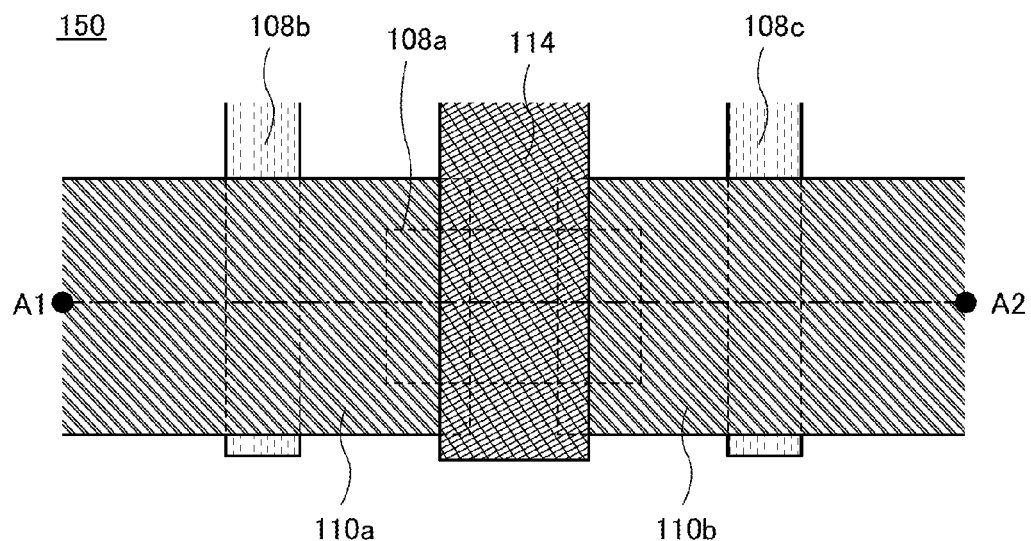
FIGS. 21A and 21B are a top view and a cross-sectional view illustrating a transistor.
Figure 21B:
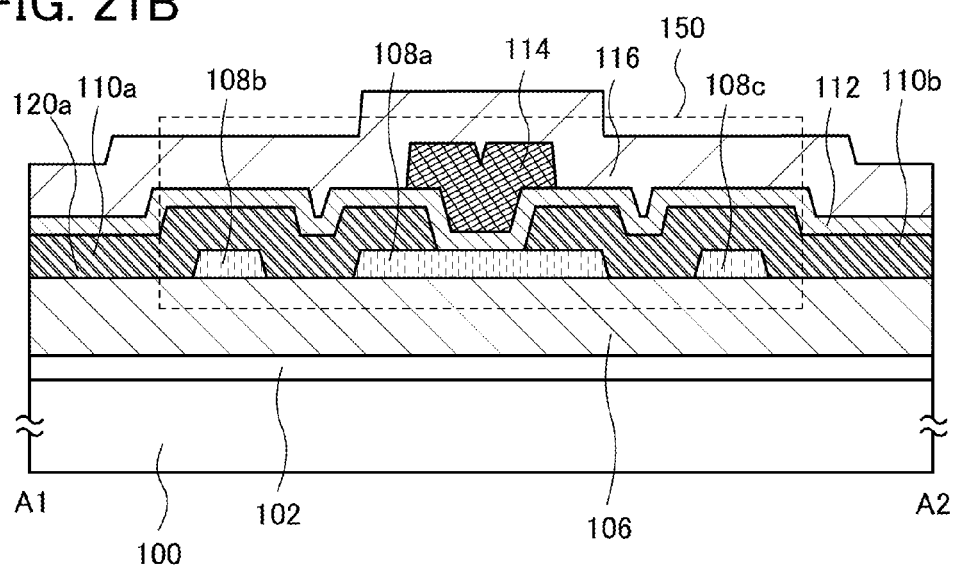

Note that one embodiment of the present invention is not limited to these examples. The conductive film 104a is not necessarily provided. The conductive films 104b and 104c are also not necessarily provided. FIGS. 21A and 21B are a top view and a cross-sectional view of a structure without the conductive films 104a, 104b, and 104c.

Like the base insulating film 102, the interlayer insulating film 106 can have a function of supplying oxygen to the oxide semiconductor film 108a as well as a function of preventing diffusion of impurities. For this reason, the interlayer insulating film 106 is preferably an insulating film containing oxygen.

The oxide semiconductor film 108a is described in detail below.

The oxide semiconductor film 108a is an oxide containing indium. An oxide can have a high carrier mobility (electron mobility) by containing indium, for example. In addition, the oxide semiconductor film 108a preferably contains an element M. The element M is aluminum, gallium, yttrium, or tin, for example. The element M is an element having a high bonding energy with oxygen, for example. The element M is an element that can increase the energy gap of the oxide, for example. In addition, the oxide semiconductor film 108a preferably contains zinc. When the oxide contains zinc, the oxide is easily crystallized, for example. The energy at the top of the valence band of the oxide can be controlled with the atomic ratio of zinc, for example.

Note that the oxide semiconductor film 108a is not limited to the oxide containing indium. The oxide semiconductor film 108a may be a Zn—Sn oxide or a Ga—Sn oxide, for example.

As the oxide semiconductor film 108a, an oxide with a wide energy gap is used. For example, the energy gap of the oxide semiconductor film 108a is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the oxide semiconductor film 108a is formed by a sputtering method, a target containing indium is preferably used in order to reduce the number of particles. In addition, if an oxide target having a high atomic ratio of the element M is used, the conductivity of the target may be decreased. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor film 108a is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor film 108a is formed by a sputtering method, a film having an atomic ratio different from the atomic ratio of the target used may be formed. In particular, the proportion of zinc in the film becomes smaller than that in the target in some cases. Specifically, the proportion of zinc in the film is approximately 40 atomic % to 90 atomic % of that of zinc in the target in some cases.

The influence of impurities in the oxide semiconductor film 108a is described below. In order that the transistor have stable electrical characteristics, it is effective to reduce the concentration of impurities in the oxide semiconductor film 108a so that the oxide semiconductor film 108a has a lower carrier density and is highly purified. The carrier density of the oxide semiconductor film 108a is set to be lower than $1 \times 10^{17}/cm^3$, lower than $1 \times 10^{15}/cm^3$, or lower than $1 \times 10^{13}/cm^3$. In order to reduce the concentration of impurities in the oxide semiconductor film 108a, the concentration of impurities in a film which is adjacent to the oxide semiconductor film 108a is preferably reduced.

For example, silicon in the oxide semiconductor film 108a might serve as a carrier trap or a carrier generation source. Therefore, the concentration of silicon in a region between the oxide semiconductor film 108a and the interlayer insulating film 106 measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor film 108a and the gate insulating film 112 measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor film 108a, the carrier density is increased in some cases. The concentration of hydrogen in the oxide semiconductor film 108a measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor film 108a, the carrier density is increased in some cases. The concentration of nitrogen in the oxide semiconductor film 108a measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the base insulating film 102 and the interlayer insulating film 106 in order to reduce the concentration of hydrogen in the oxide semiconductor film 108a. The concentration of hydrogen in the base insulating film 102 and the interlayer insulating film 106 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the base insulating film 102 and the interlayer insulating film 106 in order to reduce the concentration of nitrogen in the oxide semiconductor film 108a. The concentration of nitrogen in the base insulating film 102 and the interlayer insulating film 106 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the gate insulating film 112 in order to reduce the concentration of hydrogen in the oxide semiconductor film 108a. The concentration of hydrogen in the gate insulating film 112 measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the gate insulating film 112 in order to reduce the concentration of nitrogen in the oxide semiconductor film 108a. The concentration of nitrogen in the gate insulating film 112 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

A structure of an oxide semiconductor film which can be used as the oxide semiconductor film 108a is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

In this specification, trigonal and rhombohedral crystal systems are included in a hexagonal crystal system.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak may also be observed at $2\theta$ of around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film, a peak appear at $2\theta$ of around 31° and a peak not appear at $2\theta$ of around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Accordingly, the transistor which includes the oxide semiconductor film having a high impurity concentration and a high density of defect states can have unstable electrical characteristics.

In a transistor using the CAAC-OS film, change in electrical characteristics due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may include two or more films of an amorphous oxide semiconductor film, a microcrystalline oxide semiconductor film, and a CAAC-OS film, for example.

The oxide semiconductor film 108a may be a stack of oxide semiconductor films. For example, the oxide semiconductor film 108a may have a two-layer structure or a three-layer structure.

Figure 1C:
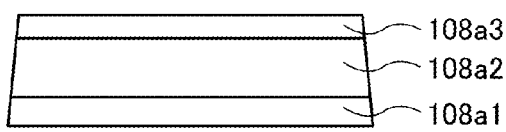

For example, the case where the oxide semiconductor film 108a has a three-layer structure is described. In FIG. 1C, the oxide semiconductor film 108a is a film in which an oxide semiconductor film 108a1, an oxide semiconductor film 108a2, and an oxide semiconductor film 108a3 are stacked in this order.

For the oxide semiconductor film 108a2 (middle layer), the above description of the oxide semiconductor film 108a can be referred to. The oxide semiconductor film 108a1 (bottom layer) and the oxide semiconductor film 108a3 (top layer) include one or more elements other than oxygen included in the oxide semiconductor film 108a2. Since the oxide semiconductor film 108a1 and the oxide semiconductor film 108a3 each include one or more elements other than oxygen included in the oxide semiconductor film 108a2, an interface state is less likely to be formed at the interface between the oxide semiconductor film 108a1 and the oxide semiconductor film 108a2 and the interface between the oxide semiconductor film 108a2 and the oxide semiconductor film 108a3.

In the case of using an In-M-Zn oxide for the oxide semiconductor film 108a1, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively. In the case of using an In-M-Zn oxide for the oxide semiconductor film 108a2, when Zn and O are not taken into consideration, the proportion of In and the proportion of M are preferably greater than or equal to 25 atomic % and less than 75 atomic %, respectively, more preferably greater than or equal to 34 atomic % and less than 66 atomic %, respectively. In the case of using an In-M-Zn oxide for the oxide semiconductor film 108a3, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively. Note that the oxide semiconductor film 108a3 may be formed using the same kind of oxide as that of the oxide semiconductor film 108a1.

Here, in some cases, there is a mixed region of the oxide semiconductor film 108a1 and the oxide semiconductor film 108a2 between the oxide semiconductor film 108a1 and the oxide semiconductor film 108a2. Further, in some cases, there is a mixed region of the oxide semiconductor film 108a2 and the oxide semiconductor film 108a3 between the oxide semiconductor film 108a2 and the oxide semiconductor film 108a3. The mixed region has a low interface state density. For that reason, the stack of the oxide semiconductor film 108a1, the oxide semiconductor film 108a2, and the oxide semiconductor film 108a3 has a band structure where energy at each interface and in the vicinity of the interface is changed continuously (continuous junction).

As the oxide semiconductor film 108a2, an oxide having an electron affinity higher than those of the oxide semiconductor films 108a1 and 108a3 is used. For example, as the oxide semiconductor film 108a2, an oxide having an electron affinity higher than those of the oxide semiconductor films 108a1 and 108a3 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

At this time, when an electric field is applied to the gate electrode 114, a channel is formed in the oxide semiconductor film 108a2 having the highest electron affinity among the oxide semiconductor film 108a1, the oxide semiconductor film 108a2, and the oxide semiconductor film 108a3.

To increase the on-state current of the transistor, the thickness of the oxide semiconductor film 108a3 is preferably as small as possible. The thickness of the oxide semiconductor film 108a3 is set to be less than 10 nm, preferably less than or equal to 5 nm, further preferably less than or equal to 3 nm, for example. Meanwhile, the oxide semiconductor film 108a3 has a function of blocking elements other than oxygen (such as silicon) included in the gate insulating film 112 from entering the oxide semiconductor film 108a2 where a channel is formed. For this reason, it is preferable that the oxide semiconductor film 108a3 have a certain thickness. The thickness of the oxide semiconductor film 108a3 is set to be greater than or equal to 0.3 nm, preferably greater than or equal to 1 nm, further preferably greater than or equal to 2 nm, for example.

To improve reliability, preferably, the thickness of the oxide semiconductor film 108a1 is large and the thickness of the oxide semiconductor film 108a3 is small. Specifically, the thickness of the oxide semiconductor film 108a1 is set to be greater than or equal to 20 nm, preferably greater than or equal to 30 nm, further preferably greater than or equal to 40 nm, still further preferably greater than or equal to 60 nm. With the oxide semiconductor film 108a1 having a thickness greater than or equal to 20 nm, preferably greater than or equal to 30 nm, further preferably greater than or equal to 40 nm, still further preferably greater than or equal to 60 nm, the distance from the interface between the interlayer insulating film 106 and the oxide semiconductor film 108a1 to the oxide semiconductor film 108a2 where the channel is formed can be greater than or equal to 20 nm, preferably greater than or equal to 30 nm, further preferably greater than or equal to 40 nm, still further preferably greater than or equal to 60 nm. To prevent the productivity of the semiconductor device from being lowered, the thickness of the oxide semiconductor film 108a1 is set to be less than or equal to 200 nm, preferably less than or equal to 120 nm, further preferably less than or equal to 80 nm.

For example, the concentration of silicon in a region between the oxide semiconductor film 108a2 and the oxide semiconductor film 108a1 measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the oxide semiconductor film 108a2 and the oxide semiconductor film 108a3 measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

It is preferable to reduce the concentration of hydrogen in the oxide semiconductor film 108a1 and the oxide semiconductor film 108a3 in order to reduce the concentration of hydrogen in the oxide semiconductor film 108a2. The concentration of hydrogen in the oxide semiconductor film 108a1 and the oxide semiconductor film 108a3 measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the oxide semiconductor film 108a1 and the oxide semiconductor film 108a3 in order to reduce the concentration of nitrogen in the oxide semiconductor film 108a2. The concentration of nitrogen in the oxide semiconductor film 108a1 and the oxide semiconductor film 108a3 measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example. For example, a two-layer structure without the oxide semiconductor film 108*a*1 or the oxide semiconductor film 108*a*3 may be employed.

As the source electrode 110*a* and the drain electrode 110*b*, a conductive film capable of extracting oxygen from the oxide semiconductor film is preferably used. As an example of the conductive film capable of extracting oxygen from the oxide semiconductor film, a conductive film containing aluminum, titanium, chromium, nickel, molybdenum, tantalum, tungsten, or the like can be given.

By the conductive film capable of extracting oxygen from the oxide semiconductor film, oxygen in the oxide semiconductor film is released to form oxygen vacancies in the oxide semiconductor film in some cases. Oxygen is more likely to be extracted as the temperature is higher. Since the manufacturing process of the transistor involves some heat treatment steps, oxygen vacancies are likely to be formed in a region of the oxide semiconductor film, which is in contact with the source electrode or the drain electrode. Furthermore, hydrogen enters sites of oxygen vacancies by heating, and thus the oxide semiconductor film becomes n-type in some cases. Thus, due to the source electrode and the drain electrode, the resistance of a region where the oxide semiconductor film is in contact with the source electrode or the drain electrode is reduced, so that the on-state resistance of the transistor can be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive film capable of appropriately extracting oxygen from an oxide semiconductor film may be used as the source electrode and the drain electrode. As the conductive film capable of appropriately extracting oxygen, a conductive film containing nickel, molybdenum, or tungsten can be used, for example.

Furthermore, in the case where a transistor with an extremely short channel length (e.g., less than or equal to 40 nm, or less than or equal to 30 nm) is manufactured, a conductive film which is less likely to extract oxygen from an oxide semiconductor film may be used as the source electrode and the drain electrode. As an example of the conductive film which is less likely to extract oxygen from an oxide semiconductor film, a conductive film containing tantalum nitride, titanium nitride, or ruthenium can be given. Note that plural kinds of conductive films may be stacked.

The gate insulating film 112 may be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 112 may be a stack including any of the above materials. The gate insulating film 112 may contain lanthanum, nitrogen, or zirconium as an impurity.

The gate electrode 114 may be formed using a conductive film containing one or more of aluminum, titanium, chromium, cobalt, nickel, copper, yttrium, zirconium, molybdenum, ruthenium, silver, tantalum, tungsten, and the like.

The oxide insulating film 116 can be formed using an insulating film containing one or more of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, and the like.

Next, a method for manufacturing the transistor is described with reference to FIGS. 2A to 2C, FIGS. 3A to 3C, and FIGS. 4A to 4C.

Figure 2A:
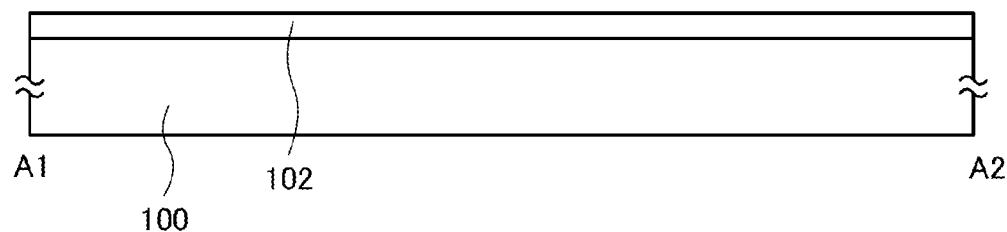
FIGS. 2A to 2C illustrate a method for manufacturing a transistor.

First, the base insulating film 102 is formed over the substrate 100 (see FIG. 2A).

The base insulating film 102 can be deposited by a sputtering method, a chemical vapor deposition (CVD) method, a metal organic CVD (MOCVD) method, a plasma-enhanced CVD (PECVD) method, a molecular beam epitaxy (MBE) method, an atomic layer deposition (ALD) method, or a pulsed laser deposition (PLD) method. It is preferable to use an MOCVD method or an ALD method in order to reduce plasma damage.

Then, CMP treatment may be performed to planarize the surface of the base insulating film 102. By CMP treatment, the average surface roughness (Ra) of the base insulating film 102 is made less than or equal to 1 nm, preferably less than or equal to 0.3 nm, more preferably less than or equal to 0.1 nm. In some cases, Ra that is less than or equal to the above value can increase the crystallinity of the oxide semiconductor film 108*a*. Ra can be measured using an atomic force microscope (AFM).

Then, oxygen may be added to the base insulating film 102 so that an insulating film containing excess oxygen can be formed. Oxygen may be added by plasma treatment, an ion implantation method, or the like. In the case where the addition of oxygen is performed by an ion implantation method, the acceleration voltage may be higher than or equal to 2 kV and lower than or equal to 100 kV and the dose may be greater than or equal to $5\times10^{14}$ ions/cm$^2$ and less than or equal to $5\times10^{16}$ ions/cm$^2$, for example.

Figure 2B:
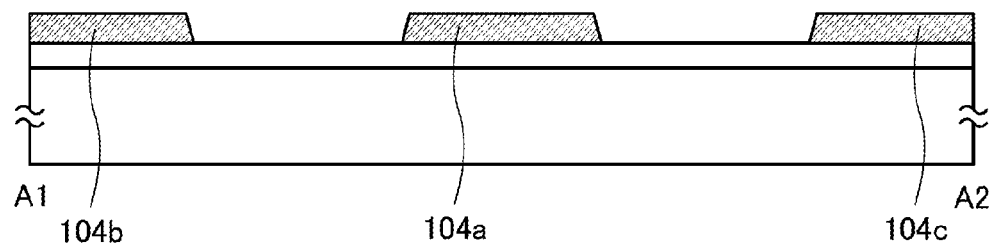

Next, the conductive films 104*a*, 104*b*, and 104*c* are formed over the base insulating film 102 (see FIG. 2B). The conductive films 104*a*, 104*b*, and 104*c*, which can be formed using the same material as the gate electrode 114, can be deposited by a sputtering method, a CVD method, an MOCVD method, a PECVD method, an MBE method, an ALD method, or a PLD method. It is preferable to use an MOCVD method or an ALD method in order to reduce plasma damage.

Figure 2C:
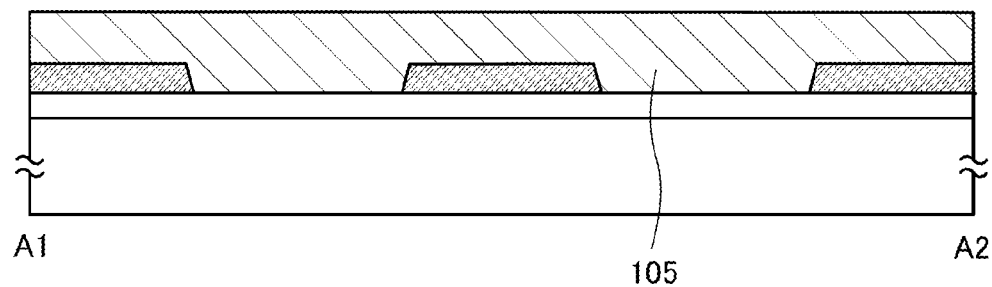

Next, an interlayer insulating film 105 is formed over the base insulating film 102 and the conductive films 104*a*, 104*b*, and 104*c* (see FIG. 2C). The interlayer insulating film 105 can be deposited by a sputtering method, a CVD method, an MOCVD method, a PECVD method, an MBE method, an ALD method, or a PLD method. It is preferable to use an MOCVD method or an ALD method in order to reduce plasma damage. In order to planarize the surface of the interlayer insulating film 105, CMP treatment may be performed. By CMP treatment, the average surface roughness (Ra) of the interlayer insulating film 105 is made less than or equal to 1 nm, preferably less than or equal to 0.3 nm, more preferably less than or equal to 0.1 nm. In some cases, Ra that is less than or equal to the above value can increase the crystallinity of the oxide semiconductor film 108*a*.

Figure 3A:
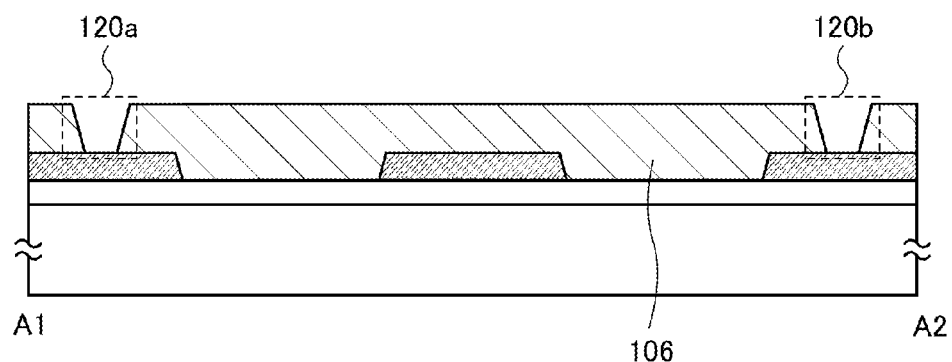
FIGS. 3A to 3C illustrate a method for manufacturing a transistor.

Then, the opening 120*a* reaching the conductive film 104*b* and the opening 120*b* reaching the conductive film 104*c* are formed in the interlayer insulating film 105, whereby the interlayer insulating film 106 is formed (see FIG. 3A).

Figure 3B:
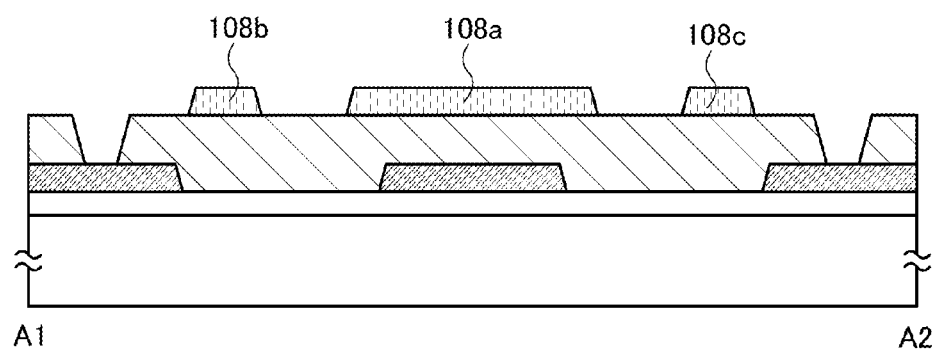

Next, the oxide semiconductor film 108*a* and the blocking films 108*b* and 108*c* are formed over the interlayer insulating film 106 by a sputtering method, a CVD method, an MOCVD method, a PECVD method, an MBE method, an ALD method, or a PLD method (see FIG. 3B). It is preferable to use an MOCVD method or an ALD method in order to reduce plasma damage. At this time, the interlayer insulating film 106 may be appropriately etched. By etching the interlayer insulating film 106 appropriately, the gate electrode 114 to be formed later can cover the oxide semiconductor film 108a easily. Note that in order to miniaturize the transistor, a hard mask may be used when processing for forming the oxide semiconductor film 108a and the blocking films 108b and 108c is performed.

Furthermore, in the case where a stacked layer including the oxide semiconductor film 108a1, the oxide semiconductor film 108a2, and the oxide semiconductor film 108a3 is formed as the oxide semiconductor film 108a, it is preferable that the layers be successively formed without exposure to the air.

In order to suppress entry of impurities to form an oxide semiconductor film having high crystallinity, the oxide semiconductor film 108a is formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor film 108a and the blocking films 108b and 108c are formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 108a and remove impurities such as water and hydrogen from the oxide semiconductor film 108a, the base insulating film 102, and the interlayer insulating film 106.

Here, the oxide semiconductor film and the blocking films are formed after the formation of the openings in the interlayer insulating film; alternatively, the openings may be formed in the interlayer insulating film after the formation of the oxide semiconductor film and the blocking films.

Figure 3C:
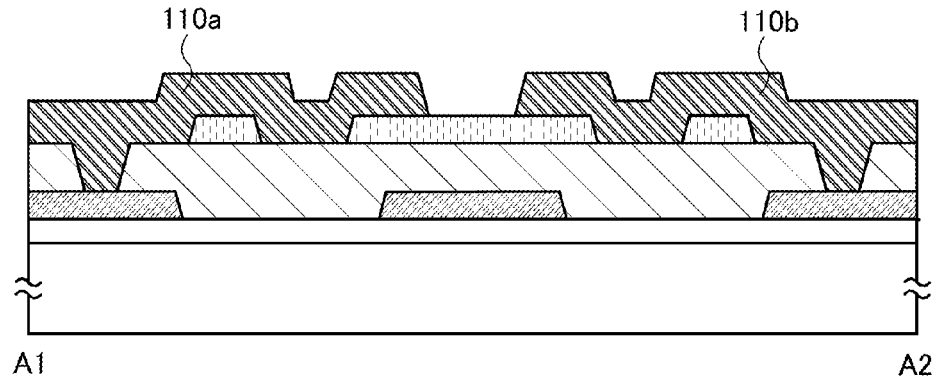

Next, the source electrode 110a that is over the oxide semiconductor film 108a and the blocking film 108b and is electrically connected to the conductive film 104b through the opening 120a provided in the interlayer insulating film 106 and the drain electrode 110b that is over the oxide semiconductor film 108a and the blocking film 108c and is electrically connected to the conductive film 104c through the opening 120b provided in the interlayer insulating film 106 are formed (see FIG. 3C). The source electrode 110a and the drain electrode 110b can be deposited by a sputtering method, a CVD method, an MOCVD method, a PECVD method, an MBE method, an ALD method, or a PLD method. It is preferable to use an MOCVD method or an ALD method in order to reduce plasma damage. Note that when a conductive film to be the source electrode 110a and the drain electrode 110b is etched, upper end portions of the source electrode 110a and the drain electrode 110b are rounded (have curved surfaces) in some cases. Furthermore, when the conductive film to be the source electrode 110a and the drain electrode 110b is etched, the interlayer insulating film 106 may be etched appropriately.

Figure 4A:
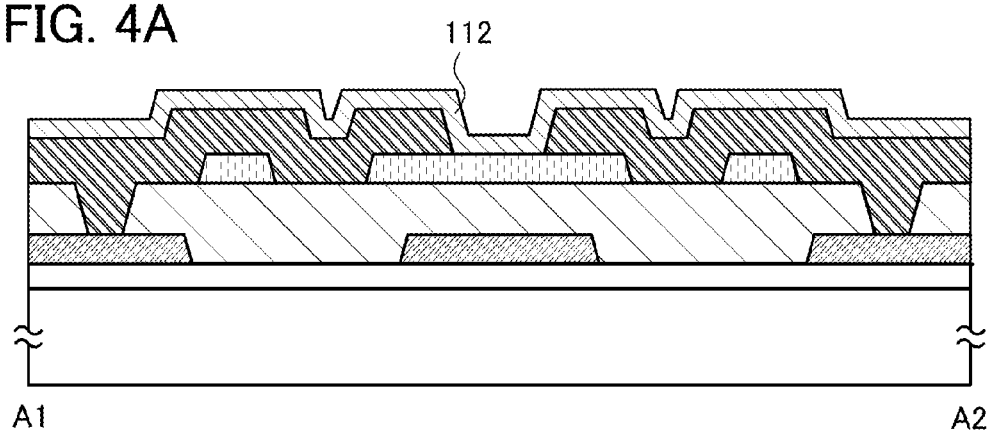
FIGS. 4A to 4C illustrate a method for manufacturing a transistor.

Next, the gate insulating film 112 is formed over the oxide semiconductor film 108a, the source electrode 110a, and the drain electrode 110b (see FIG. 4A). The gate insulating film 112 can be deposited by a sputtering method, a CVD method, an MOCVD method, a PECVD method, an MBE method, an ALD method, or a PLD method. It is preferable to use an MOCVD method or an ALD method in order to reduce plasma damage.

Figure 4B:
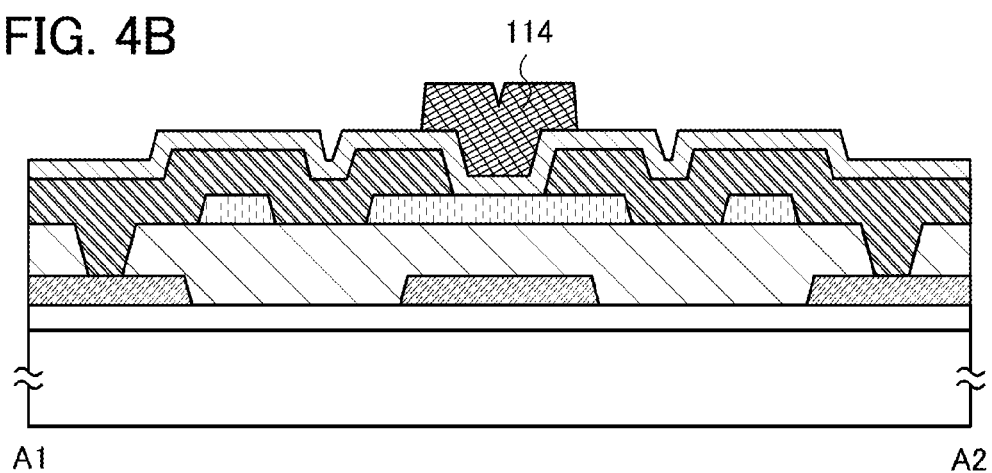

Next, the gate electrode 114 is formed over the gate insulating film 112 (see FIG. 4B).

Figure 4C:
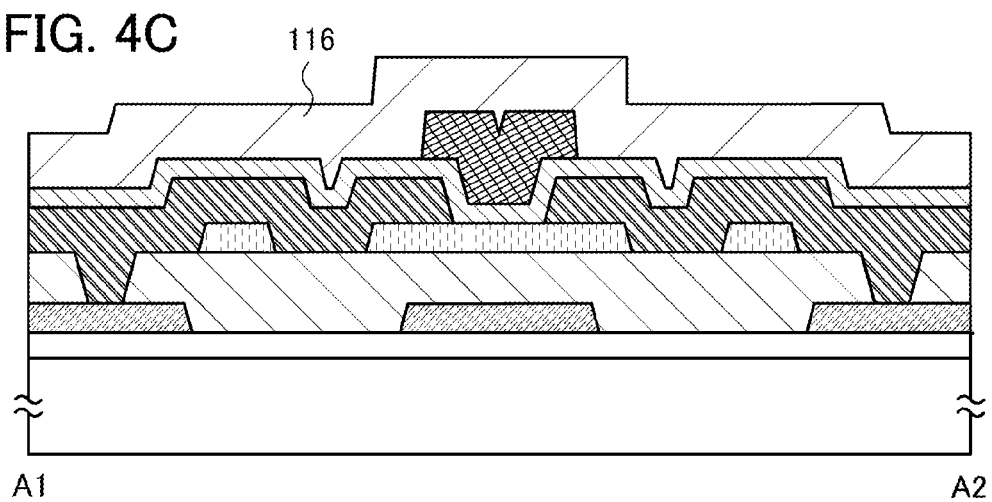

Next, the oxide insulating film 116 is formed over the gate insulating film 112 and the gate electrode 114 (see FIG. 4C). The oxide insulating film 116 can be formed by a sputtering method, a CVD method, an MBE method, an ALD method, or a PLD method.

Next, second heat treatment may be performed. The second heat treatment can be performed under conditions similar to those of the first heat treatment. The second heat treatment allows reducing oxygen vacancies in the oxide semiconductor film 108a in some cases.

Through the above steps, the transistor illustrated in FIGS. 1A and 1B can be manufactured.

<Modification Example of Transistor Structure>

Figure 5A:
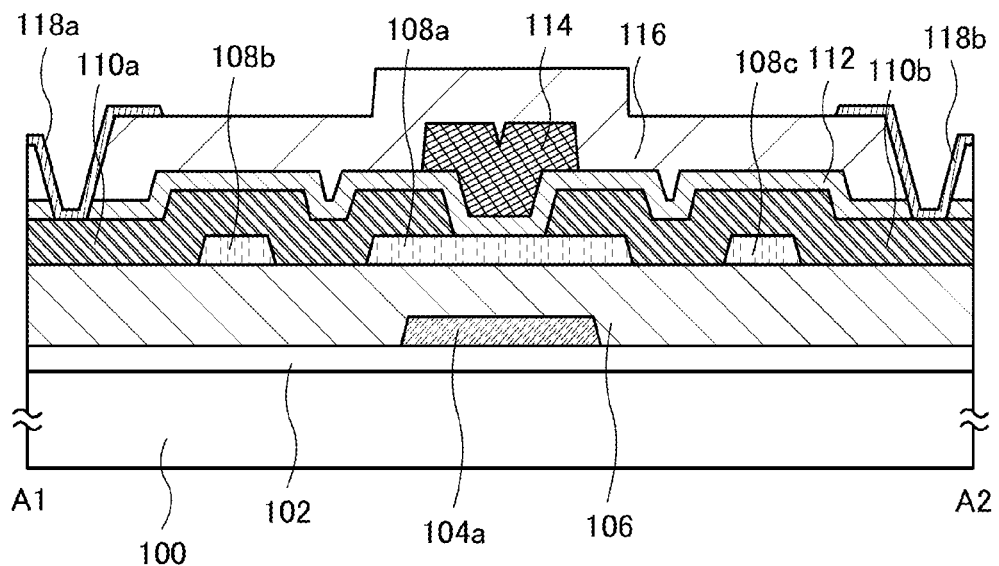
FIGS. 5A and 5B are each a cross-sectional view illustrating a transistor.

Furthermore, as in the transistor shown in FIG. 5A, a conductive film 118a and a conductive film 118b that are electrically connected to the source electrode 110a and the drain electrode 110b and function as wirings may be provided over the oxide insulating film 116. The conductive films 118a and 118b may be electrically connected to an element such as a transistor or a capacitor.

Figure 5B:
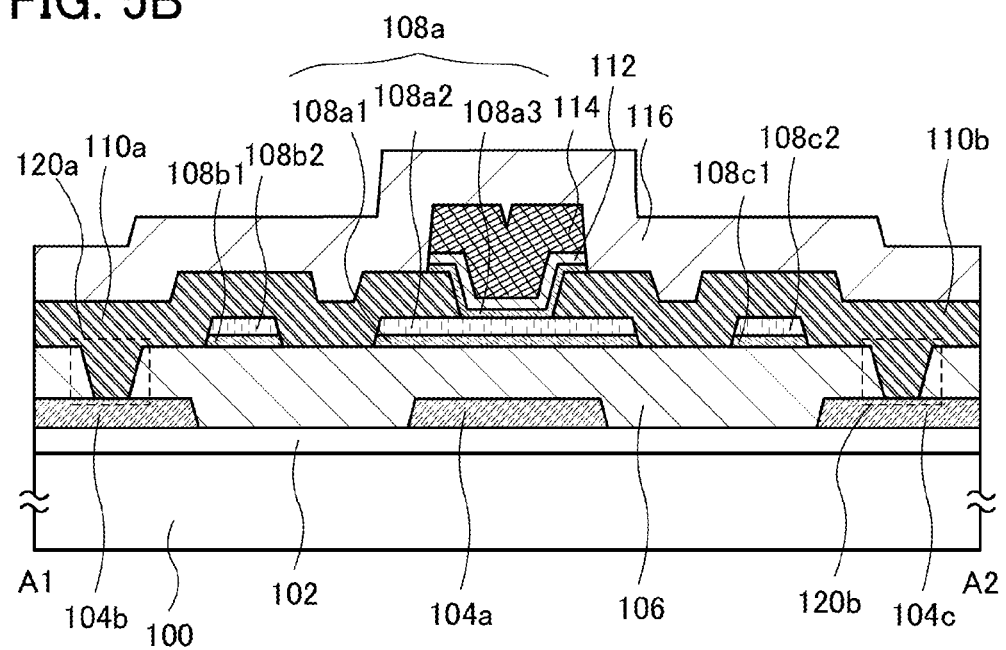

As in the transistor shown in FIG. 5B, the following structure may be employed: the oxide semiconductor film 108a has a three-layer structure; the oxide semiconductor films 108a1 and 108a2 and a blocking film 108b1, a blocking film 108b2, a blocking film 108c1, and a blocking film 108c2 are provided over an interlayer insulating film; and the oxide semiconductor film 108a3 is provided over a source electrode and a drain electrode. In this structure, the oxide semiconductor film 108a3 and a gate insulating film may be obtained by etching using a gate electrode as a mask.

<Modification Example of Transistor Structure>

Figure 10:
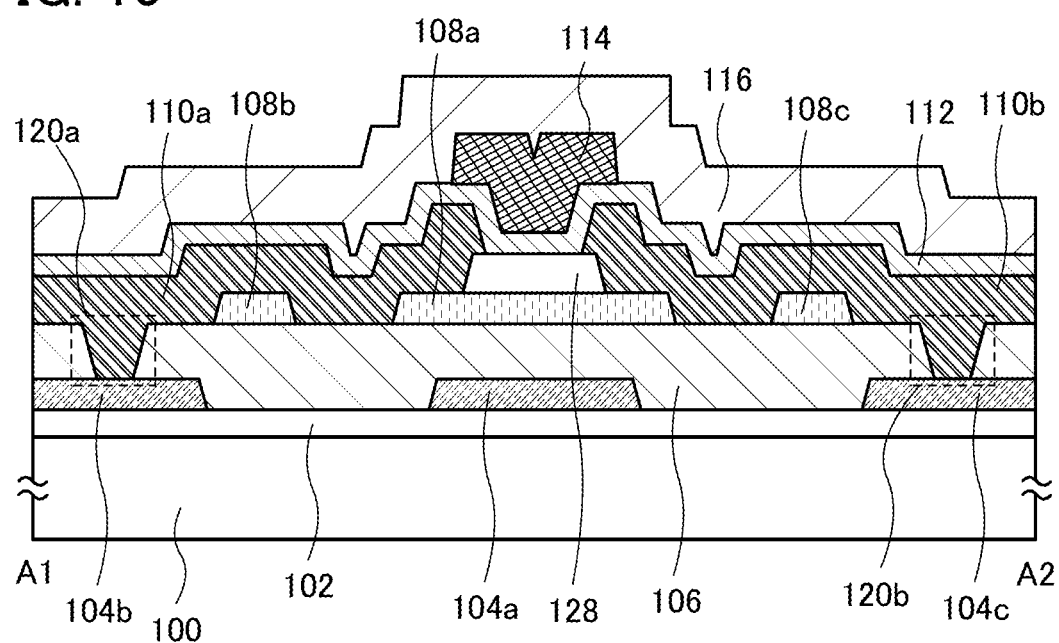
FIG. 10 is a cross-sectional view illustrating a transistor.

Furthermore, as in the transistor shown in FIG. 10, a channel protective film 128 may be provided over the oxide semiconductor film 108a. With the channel protective film 128, the oxide semiconductor film 108a is not exposed to an etching gas, so that impurities between the oxide semiconductor film 108a and the channel protective film 128 can be reduced. As a result, leakage current flowing between the source electrode and the drain electrode of the transistor can be reduced.

This embodiment can be combined with any of the other embodiments in this specification as appropriate.

(Embodiment 2)

In this embodiment, a semiconductor device which is different from that in Embodiment 1 is described with reference to drawings.

Figure 6A:
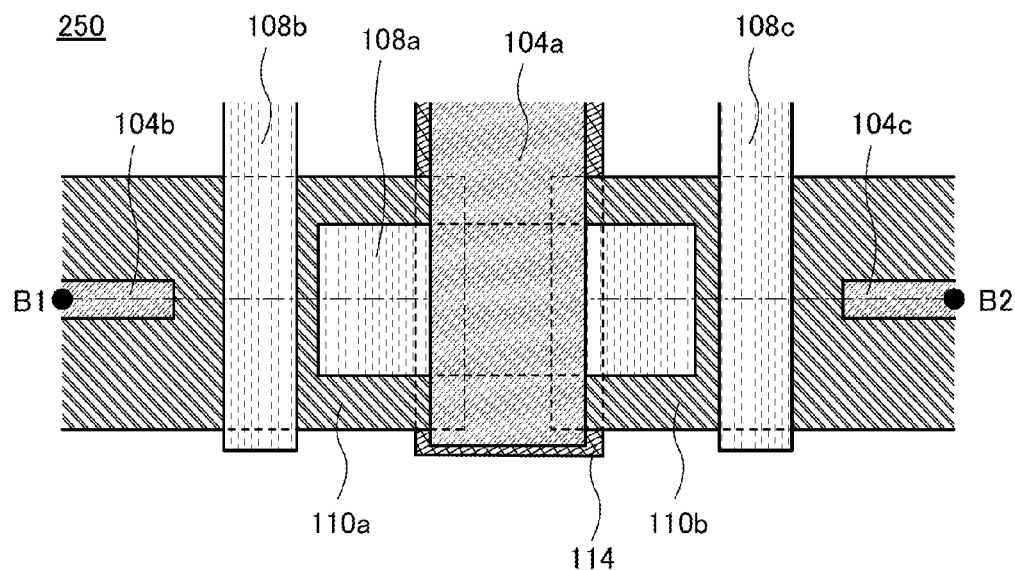
FIGS. 6A and 6B are a top view and a cross-sectional view illustrating a transistor.
Figure 6B:
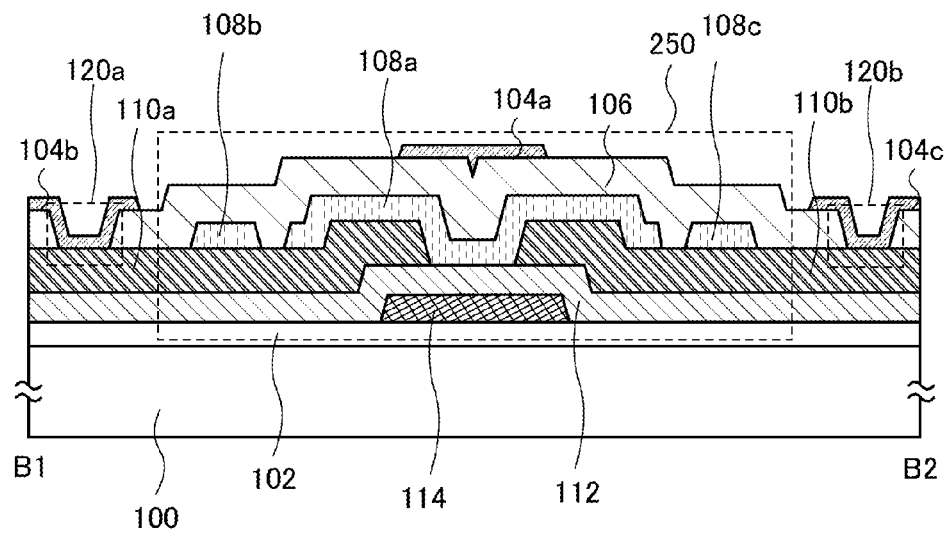

FIGS. 6A and 6B are a top view and a cross-sectional view of a transistor of one embodiment of the present invention. FIG. 6A is the top view, and FIG. 6B illustrates a cross section taken along a dashed-dotted line B1-B2 in FIG. 6A. Note that for simplification of the drawing, some components are not illustrated in the top view in FIG. 6A. In some cases, the direction of the dashed-dotted line B1-B2 is referred to as a channel length direction, and the direction perpendicular to that of the dashed-dotted line B1-B2 is referred to as a channel width direction.

A transistor 250 in FIGS. 6A and 6B includes the base insulating film 102 over the substrate 100; the gate electrode 114 over the base insulating film 102; the gate insulating film 112 over the base insulating film 102 and the gate electrode 114; the source electrode 110a and the drain electrode 110b over the gate insulating film 112; the oxide semiconductor film 108a over the gate insulating film 112, the source electrode 110a, and the drain electrode 110b; the blocking film 108b over the source electrode 110a; the blocking film 108c over the drain electrode 110b; the interlayer insulating film 106 over the source electrode 110a, the drain electrode 110b, the oxide semiconductor film 108a, and the blocking films 108b and 108c; the conductive film 104a over the interlayer insulating film 106; the conductive film 104b that is over the interlayer insulating film 106 and is electrically connected to the source electrode 110a through the opening 120a provided in the interlayer insulating film 106; and the conductive film 104c that is over the interlayer insulating film 106 and is electrically connected to the drain electrode 110b through the opening 120b provided in the interlayer insulating film 106.

The blocking film 108b is closer to the oxide semiconductor film 108a than the opening 120a is. In other words, the distance between the blocking film 108b and the oxide semiconductor film 108a is shorter than the distance between the opening 120a and the oxide semiconductor film 108a. Similarly, the blocking film 108c is closer to the oxide semiconductor film 108a than the opening 120b is. In other words, the distance between the blocking film 108c and the oxide semiconductor film 108a is shorter than the distance between the opening 120b and the oxide semiconductor film 108a.

The blocking film in the above arrangement adsorbs an impurity such as hydrogen that enters from another layer through the opening, and therefore has a function of preventing entry of the impurity to the oxide semiconductor film. Therefore, electrical characteristics of a semiconductor device can be prevented from being impaired.

In addition, the blocking film can be formed using the same material as the oxide semiconductor film on the same surface as the oxide semiconductor film. Thus, the blocking film can be formed without an increase in the number of manufacturing steps. Without being limited thereto, the blocking film can be formed using a material different from those of the oxide semiconductor film and the source electrode (or the drain electrode).

The blocking film adsorbs an impurity such as hydrogen and accordingly has a higher impurity concentration than that of the oxide semiconductor film. Therefore, the blocking film has higher conductivity than that of the oxide semiconductor film.

Next, a method for manufacturing the transistor is described with reference to FIGS. 7A to 7C, FIGS. 8A to 8C, and FIGS. 9A and 9B.

Figure 7A:
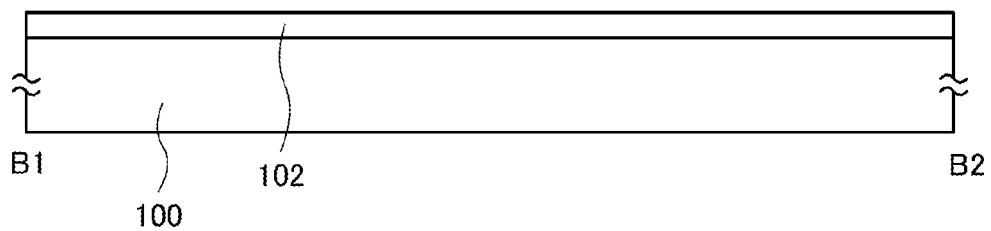
FIGS. 7A to 7C illustrate a method for manufacturing a transistor.

First, the base insulating film 102 is formed over the substrate 100 (see FIG. 7A). Embodiment 1 can be referred to for a material and a formation method of the base insulating film 102.

Figure 7B:
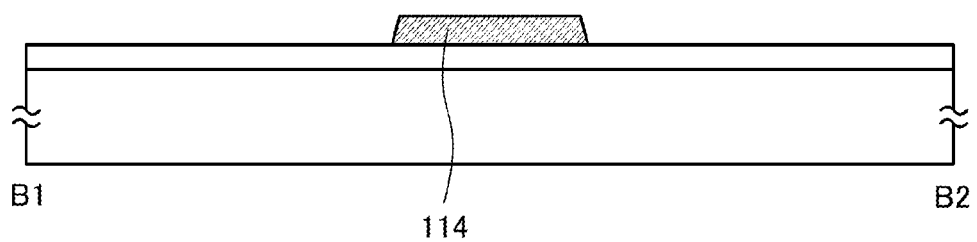

Next, the gate electrode 114 is formed over the base insulating film 102 (see FIG. 7B). Embodiment 1 can be referred to for a material and a formation method of the gate electrode 114.

Figure 7C:
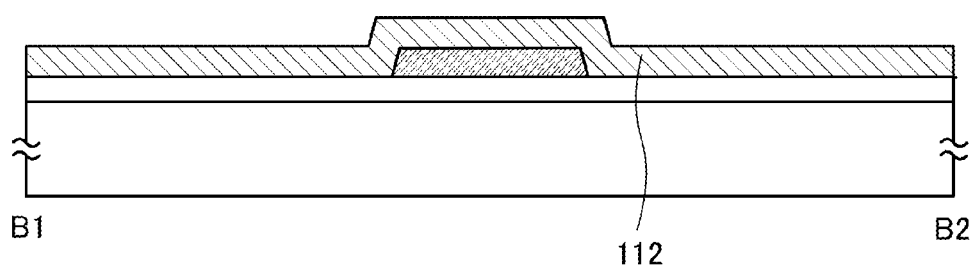

Next, the gate insulating film 112 is formed over the base insulating film 102 and the gate electrode 114 (see FIG. 7C). Embodiment 1 can be referred to for a material and a formation method of the gate insulating film 112.

Figure 8A:
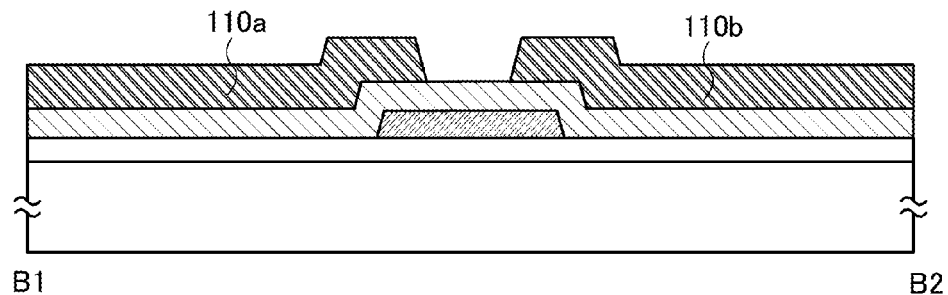
FIGS. 8A to 8C illustrate a method for manufacturing a transistor.

Then, the source electrode 110a and the drain electrode 110b are formed over the gate insulating film 112 (see FIG. 8A). Embodiment 1 can be referred to for materials and formation methods of the source electrode 110a and the drain electrode 110b.

Figure 8B:
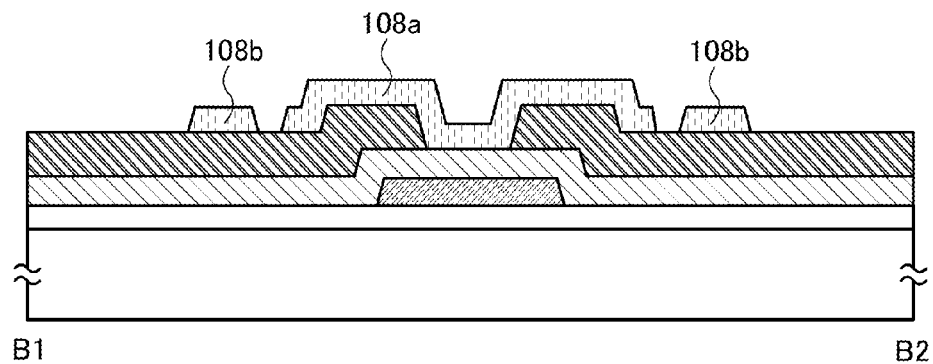

Next, the oxide semiconductor film 108a and the blocking films 108b and 108c are formed over the gate insulating film 112, the source electrode 110a, and the drain electrode 110b (see FIG. 8B). Embodiment 1 can be referred to for materials and formation methods of the oxide semiconductor film 108a and the blocking films 108b and 108c.

Furthermore, in the case where a stacked layer including the oxide semiconductor film 108a1, the oxide semiconductor film 108a2, and the oxide semiconductor film 108a3 is formed as the oxide semiconductor film 108a, it is preferable that the layers be successively formed without exposure to the air.

First heat treatment may be performed after the oxide semiconductor film 108a and the blocking films 108b and 108c are formed. Embodiment 1 can be referred to for details of the first heat treatment.

Figure 8C:
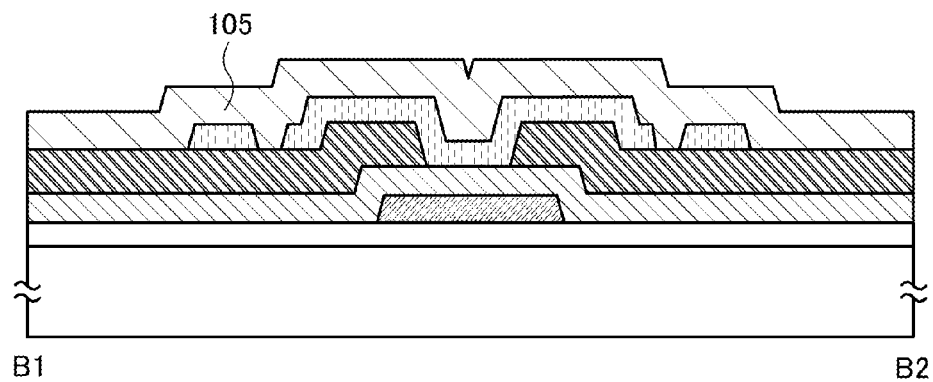

Next, the interlayer insulating film 105 is formed over the oxide semiconductor film 108a, the blocking films 108b and 108c, the source electrode 110a, and the drain electrode 110b (see FIG. 8C). Embodiment 1 can be referred to for a material and a formation method of the interlayer insulating film 105.

Figure 9A:
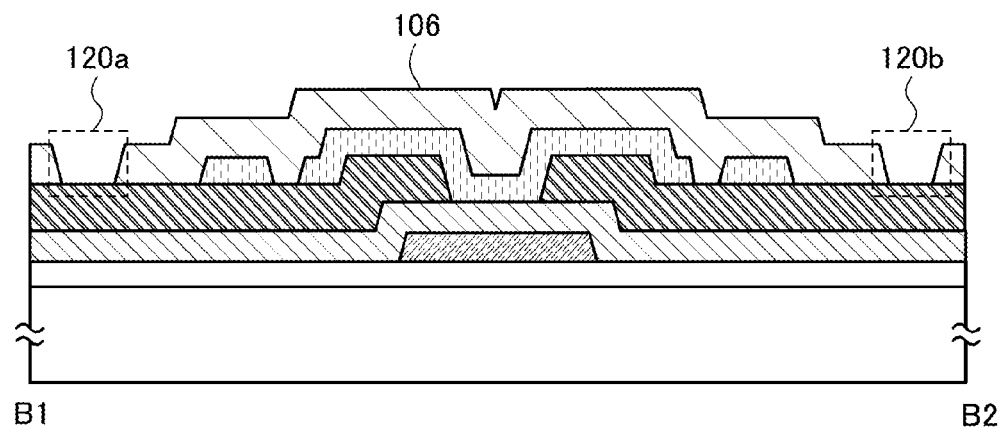
FIGS. 9A and 9B illustrate a method for manufacturing a transistor.

Then, the opening 120a reaching the source electrode 110a and the opening 120b reaching the drain electrode 110b are formed in the interlayer insulating film 105, whereby the interlayer insulating film 106 is formed (see FIG. 9A).

Figure 9B:
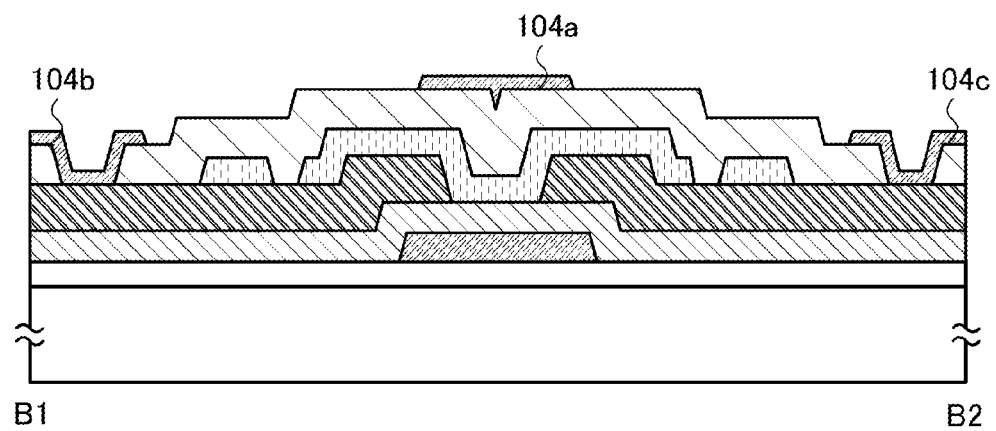

Next, the conductive film 104a over the interlayer insulating film 106, the conductive film 104b that is over the interlayer insulating film 106 and is electrically connected to the source electrode 110a through the opening 120a provided in the interlayer insulating film 106, and the conductive film 104c that is over the interlayer insulating film 106 and is electrically connected to the drain electrode 110b through the opening 120b provided in the interlayer insulating film 106 are formed (see FIG. 9B). Embodiment 1 can be referred to for description of the conductive films 104a, 104b, and 104c.

Next, second heat treatment may be performed. The second heat treatment can be performed under conditions similar to those of the first heat treatment. The second heat treatment allows reducing oxygen vacancies in the oxide semiconductor film 108a in some cases.

Through the above steps, the transistor illustrated in FIGS. 6A and 6B can be manufactured.

This embodiment can be combined with any of the other embodiments in this specification as appropriate.

(Embodiment 3)

In this embodiment, an example of a circuit including the transistor of one embodiment of the present invention is described with reference to drawings.

[Cross-Sectional Structure]

Figure 11A:
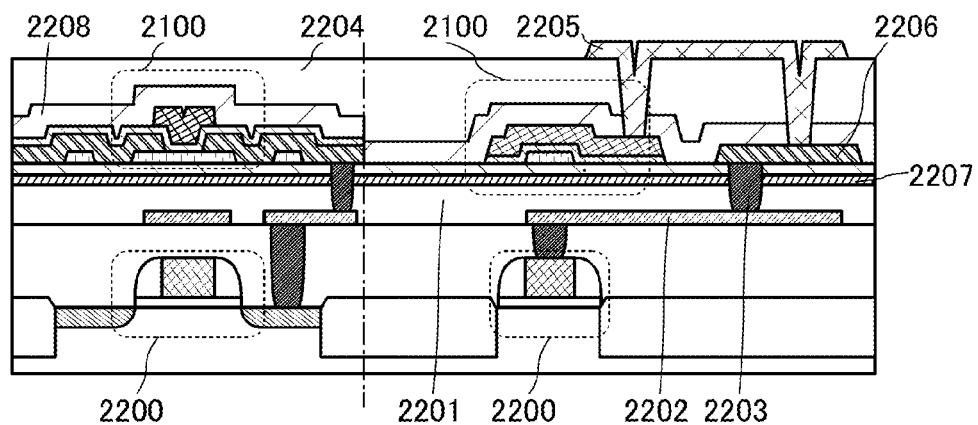
FIGS. 11A to 11C are a cross-sectional view and circuit diagrams of a semiconductor device of one embodiment.

FIG. 11A is a cross-sectional view of a semiconductor device of one embodiment of the present invention. The semiconductor device illustrated in FIG. 11A includes a transistor 2200 containing a first semiconductor material in a lower portion and a transistor 2100 containing a second semiconductor material in an upper portion. In FIG. 11A, an example is described in which the transistor described in Embodiment 1 as an example is used as the transistor 2100 containing the second semiconductor material.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 11A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating film 2208 having a function of preventing diffusion of hydrogen is preferably formed over the transistor 2100 to cover the transistor 2100 including an oxide semiconductor film. For the insulating film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating film 2208 covering the transistor 2100, release of oxygen from the oxide semiconductor film included in the transistor 2100 can be prevented and entry of water and hydrogen into the oxide semiconductor film can be prevented.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

Figure 11B:
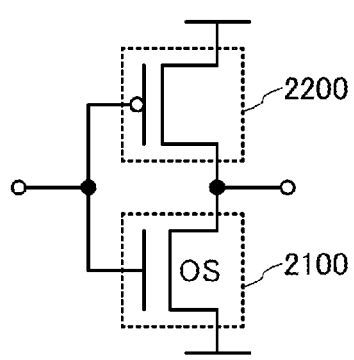

A circuit diagram in FIG. 11B shows a configuration of a so-called CMOS circuit in which the p-channel transistor 2200 and the n-channel transistor 2100 are connected to each other in series and in which gates of them are connected to each other.

[Analog Switch]

Figure 11C:
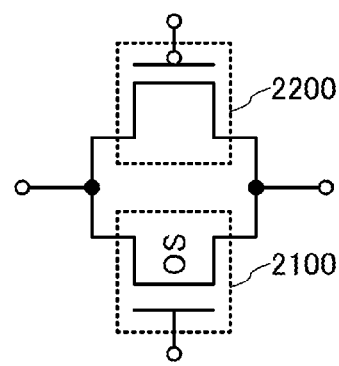

A circuit diagram in FIG. 11C shows a configuration in which sources of the transistors 2100 and 2200 are connected to each other and drains of the transistors 2100 and 2200 are connected to each other. With such a configuration, the transistors can function as a so-called analog switch.

[Memory Device Example]

Figure 12A:
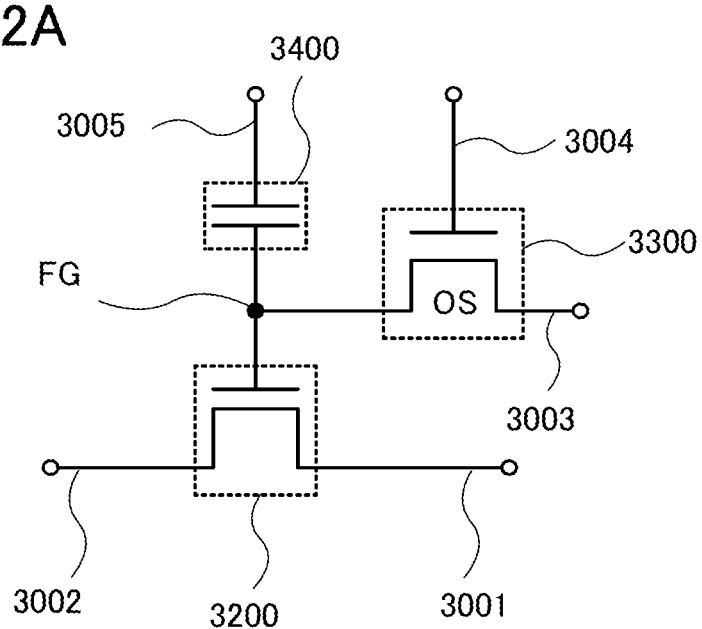
FIGS. 12A and 12B each illustrate a structure example of a memory device of one embodiment.
Figure 12B:
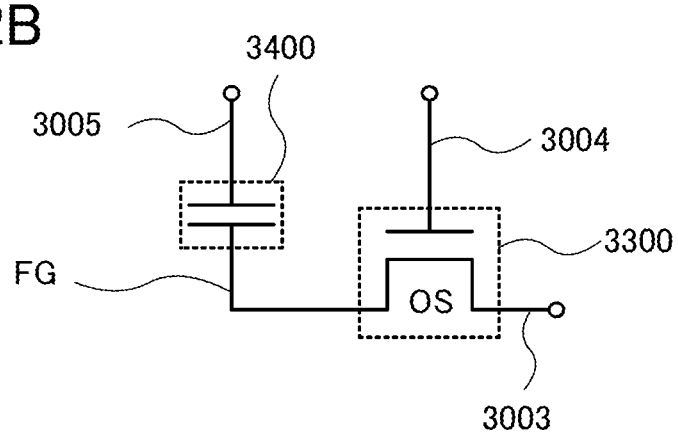

An example of a semiconductor device (memory device) which includes the transistor of one embodiment of the present invention, which can retain stored data even when not powered, and which has an unlimited number of write cycles is shown in FIGS. 12A and 12B.

The semiconductor device illustrated in FIG. 12A includes a transistor 3200 using a first semiconductor material, a transistor 3300 using a second semiconductor material, and a capacitor 3400. Note that any of the above-described transistors can be used as the transistor 3300.

The transistor 3300 is a transistor in which a channel is formed in a semiconductor film including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 12A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 12A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 12B is different mainly from the semiconductor device illustrated in FIG. 12A in that the transistor 3200 is not provided. Also in this case, writing and retaining operation of data can be performed in a manner similar to the semiconductor device illustrated in FIG. 12A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

This embodiment can be combined with any of the other embodiments in this specification as appropriate.

(Embodiment 4)

In this embodiment, an RFID tag that includes the transistor described in the above embodiments or the memory device described in the above embodiment is described with reference to FIG. 13.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag will be described with reference to FIG. 13. FIG. 13 is a block diagram illustrating a configuration example of an RFID tag.

Figure 13:
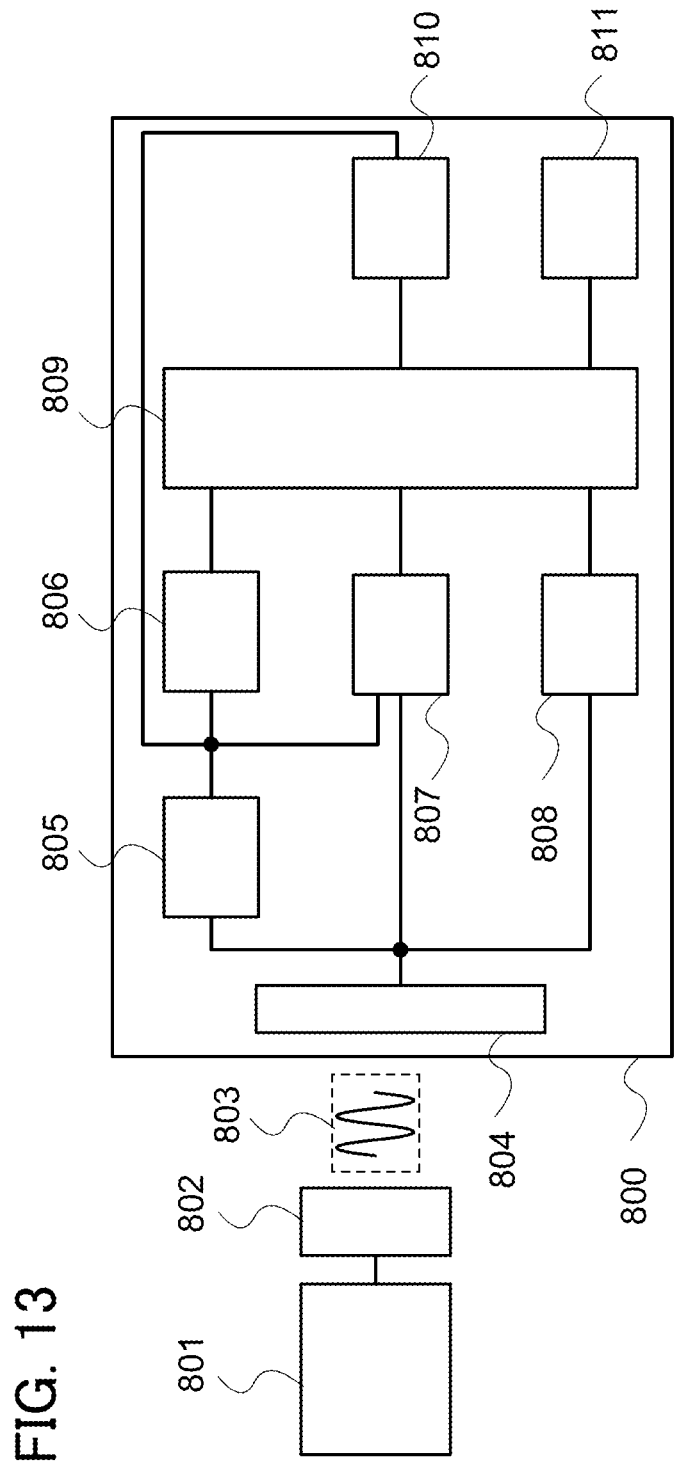
FIG. 13 illustrates a structure example of an RFID tag of one embodiment.

As shown in FIG. 13, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory device of one embodiment of the present invention can retain data even when not powered, the memory device can be favorably used for an RFID tag. Furthermore, the memory device of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the other embodiments described in this specification as appropriate.

(Embodiment 5)

In this embodiment, a CPU in which at least the transistor described in any of the above embodiments can be used and the memory device described in the above embodiment is included is described.

Figure 14:
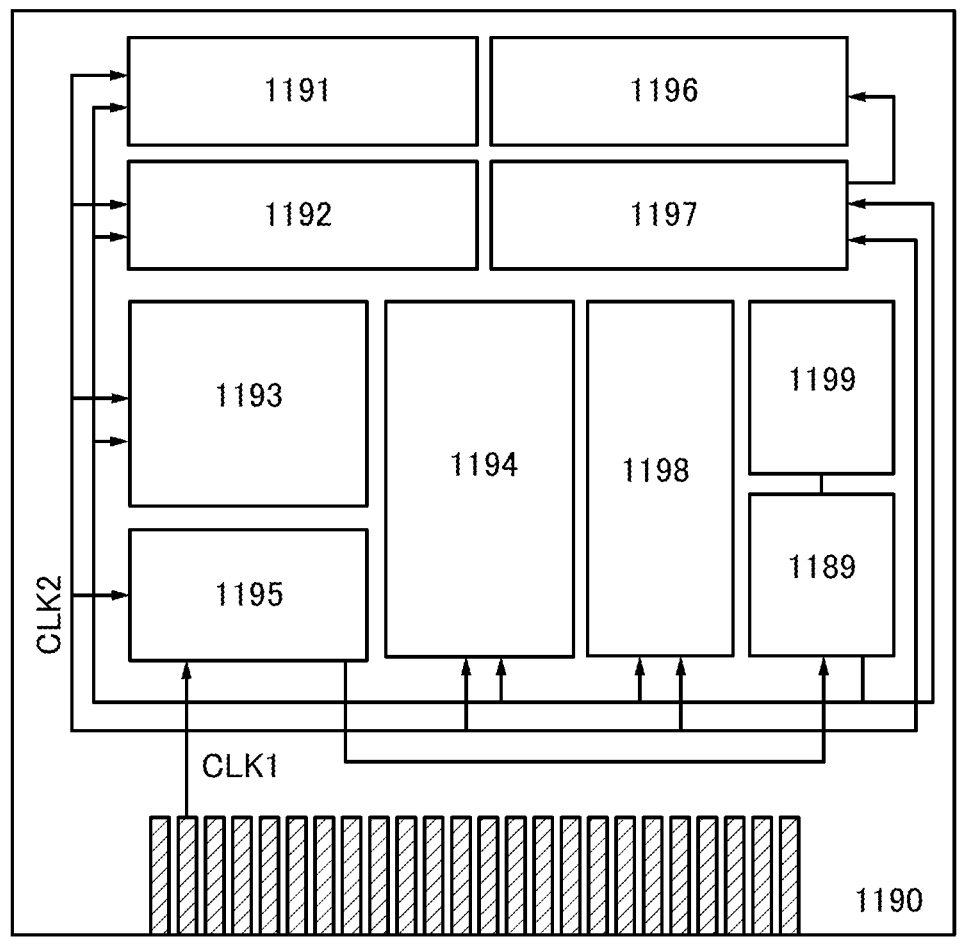
FIG. 14 illustrates a structure example of a CPU of one embodiment.

FIG. 14 is a block diagram illustrating a configuration example of a CPU at least partly including any of the transistors described in the above embodiments as a component.

The CPU illustrated in FIG. 14 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS IF), a rewritable ROM 1199, and a ROM interface (ROM IF) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 14 is just an example in which the configuration is simplified, and an actual CPU may have a variety of configurations depending on the application. For example, the CPU may have the following configuration: a structure including the CPU illustrated in FIG. 14 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 14, a memory cell is provided in the register 1196. For the memory cell of the register 1196, any of the transistors described in the above embodiments can be used.

In the CPU illustrated in FIG. 14, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 15:
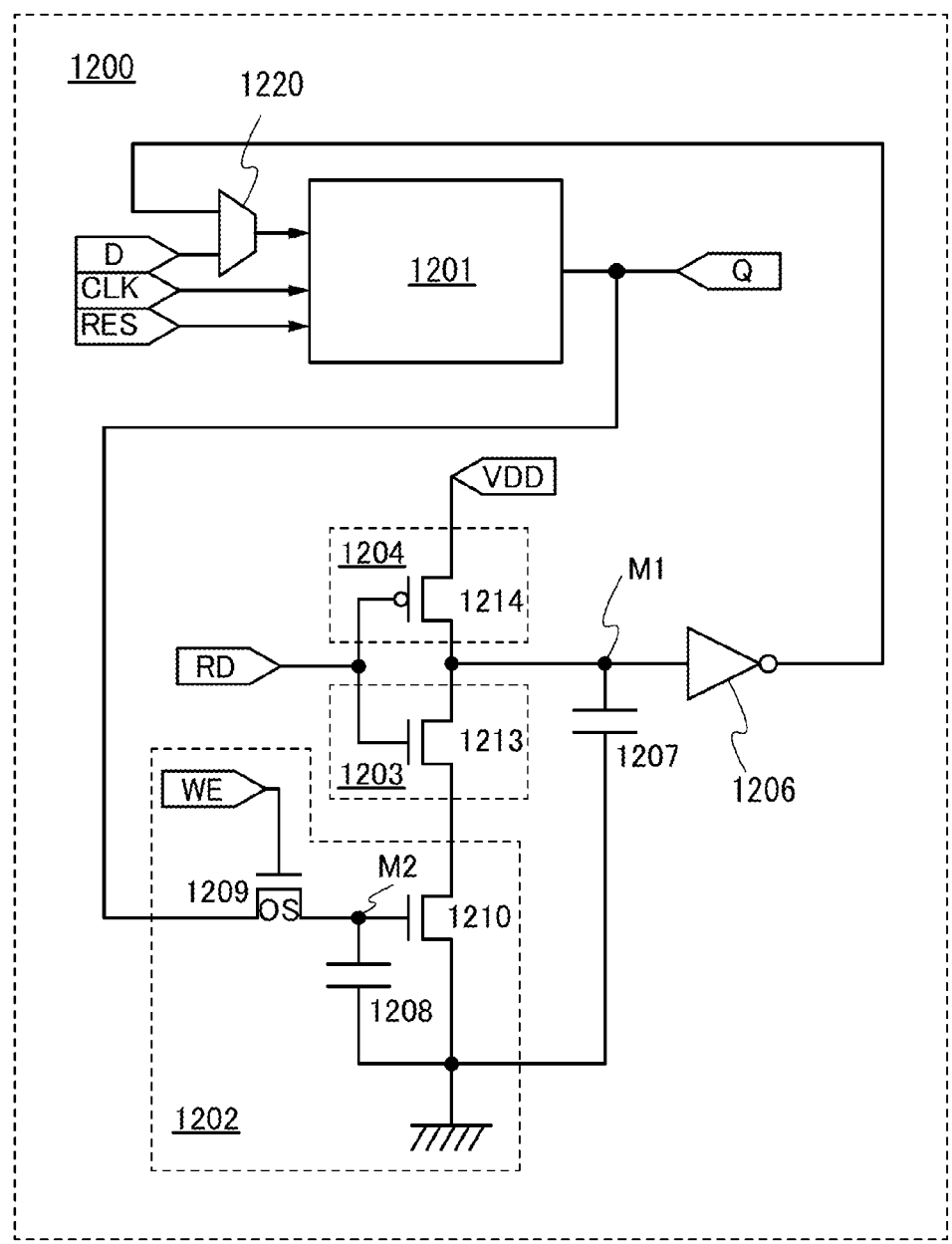
FIG. 15 is a circuit diagram of a memory element of one embodiment.

FIG. 15 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 15 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 15, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 15, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor film. Further alternatively, in the memory element 1200, a transistor in which a channel is formed in an oxide semiconductor film can be included besides the transistor 1209, and a transistor in which a channel is formed in a layer or the substrate 1190 including a semiconductor other than an oxide semiconductor can be used for the rest of the transistors.

As the circuit 1201 in FIG. 15, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

This embodiment can be combined with any of the other embodiments in this specification as appropriate.

(Embodiment 6)

In this embodiment, a structure example of a display panel of one embodiment of the present invention is described.

[Structure Example]

Figure 19A:
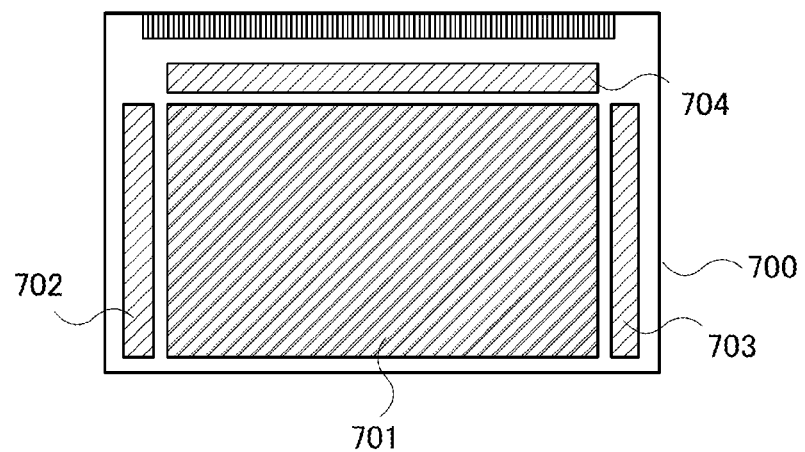
FIGS. 19A to 19C illustrate a display device of one embodiment.
Figure 19B:
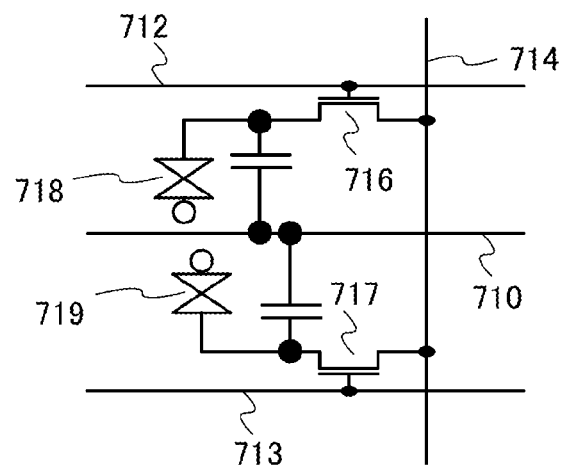
Figure 19C:
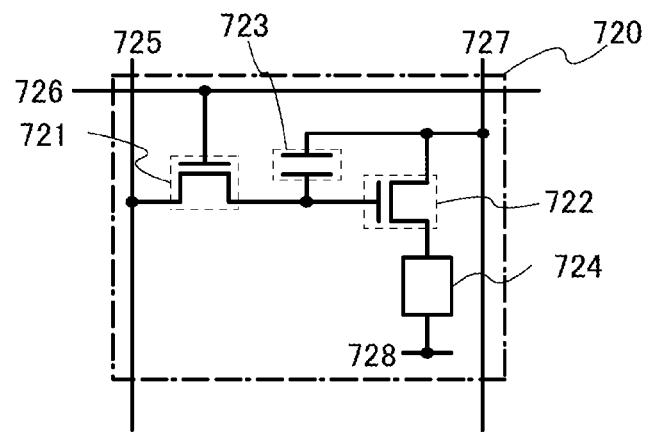

FIG. 19A is a top view of the display panel of one embodiment of the present invention. FIG. 19B is a circuit diagram illustrating a pixel circuit that can be used in the case where a liquid crystal element is used in a pixel in the display panel of one embodiment of the present invention. FIG. 19C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 19A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 19A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 19B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 19B. For example, a switch, a resistor, a capacitor, a transistor, a sensor, a logic circuit, or the like may be added to the pixel illustrated in FIG. 19B.

[Organic EL Panel]

FIG. 19C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 19C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 19C. For example, a switch, a resistor, a capacitor, a sensor, a transistor, a logic circuit, or the like may be added to the pixel circuit illustrated in FIG. 19C.

In the case where the transistor shown in any of the above embodiments is used for the circuit shown in FIGS. 19A to 19C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

This embodiment can be combined with any of the other embodiments in this specification as appropriate.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 16A to 16F illustrate specific examples of these electronic devices.

Figure 16A:
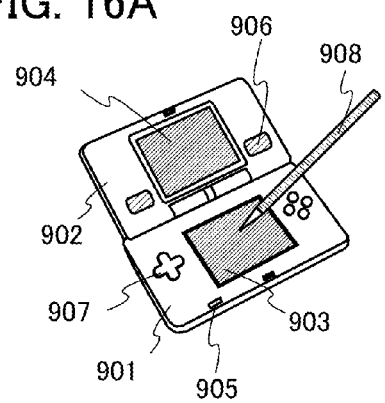
FIGS. 16A to 16F each illustrate an electronic device of one embodiment.

FIG. 16A illustrates a portable game console including a housing 901, a housing 902, a display portion 903, a display portion 904, a microphone 905, a speaker 906, an operation key 907, a stylus 908, and the like. Although the portable game machine in FIG. 16A has the two display portions 903 and 904, the number of display portions included in a portable game machine is not limited to this.

Figure 16B:
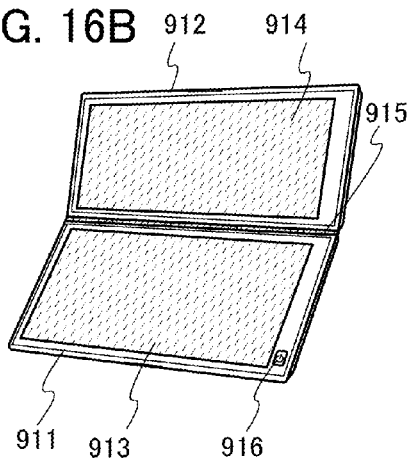

FIG. 16B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 16C:
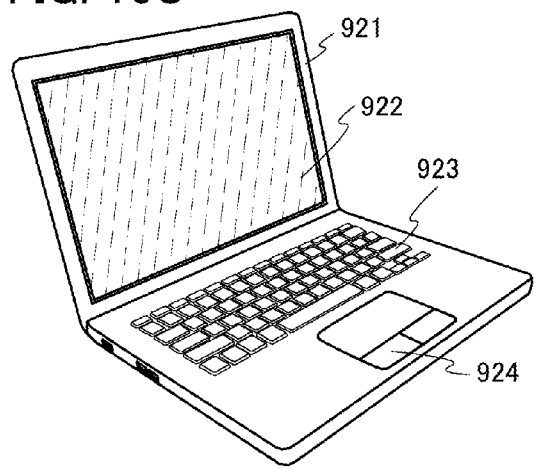

FIG. 16C illustrates a laptop personal computer, which includes a housing 921, a display portion 922, a keyboard 923, a pointing device 924, and the like.

Figure 16D:
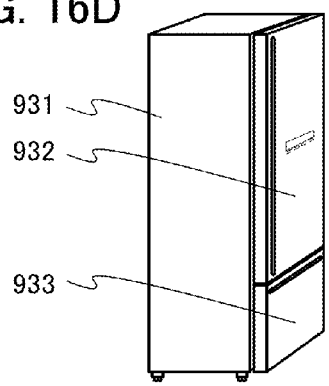

FIG. 16D illustrates an electric refrigerator-freezer including a housing 931, a door for a refrigerator 932, a door for a freezer 933, and the like.

Figure 16E:
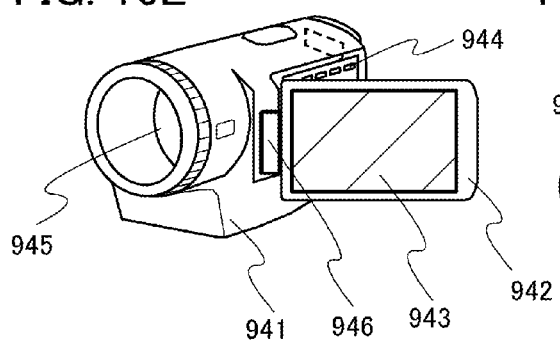

FIG. 16E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 16F:
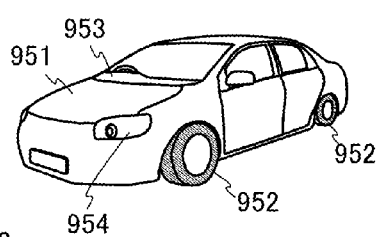
Figure 17A:
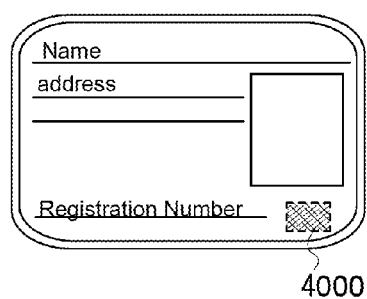
FIGS. 17A to 17F each illustrate an application example of an RFID of one embodiment.
Figure 17B:
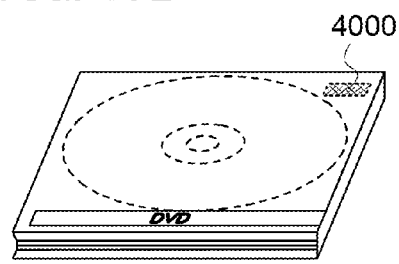
Figure 17C:
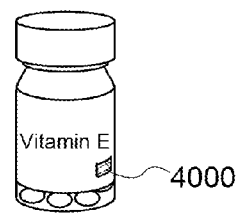
Figure 17D:
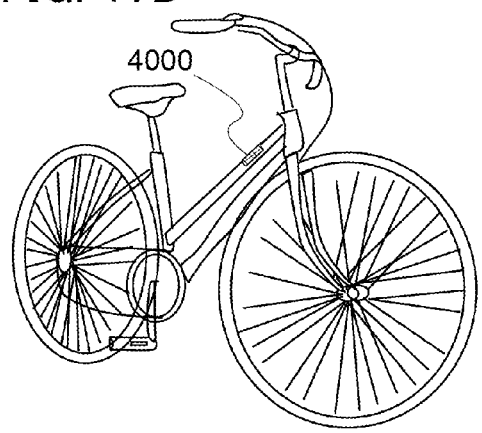
Figure 17E:
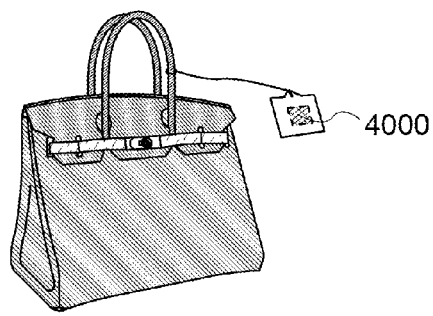
Figure 17F:
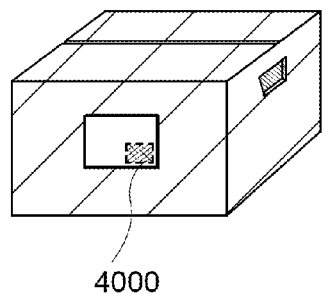

FIG. 16F illustrates an ordinary vehicle including a car body 951, wheels 952, a dashboard 953, lights 954, and the like.

This embodiment can be combined with any of the other embodiments in this specification as appropriate.

(Embodiment 8)

In this embodiment, application examples of an RFID of one embodiment of the present invention will be described with reference to FIGS. 17A to 17F. The RFID is widely used and can be provided for, for example, products such as bills, coins, securities, bearer bonds, documents (e.g., driver's licenses or resident's cards, see FIG. 17A), recording media (e.g., DVD software or video tapes, see FIG. 17B), packaging containers (e.g., wrapping paper or bottles, see FIG. 17C), vehicles (e.g., bicycles, see FIG. 17D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 17E and 17F).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

This embodiment can be combined with any of the other embodiments in this specification as appropriate.

[Example]

In this example, a transistor having the same structure as the transistor illustrated in FIG. 5B was fabricated as an example sample and the electrical characteristics of the transistor were evaluated.

First, a method for fabricating the example sample will be described.

Over a silicon transistor, a 900-nm-thick silicon oxide film made of tetraethyl ortho-silicate (TEOS) to be an interlayer insulating film was formed by a CVD method.

Next, CMP treatment was performed on the silicon oxide film to planarize the surface thereof. The conditions of the CMP treatment were set as follows: polishing pad for CMP was polyurethane-based polishing cloth; slurry was NP8020 (produced by Nitta Haas Incorporated) in undiluted form (a grain size of silica of 60 nm to 80 nm); the slurry temperature was room temperature; the polishing pressure was 0.08 MPa; the number of spindle rotations on a side where the substrate was fixed was 51 rpm; and the number of rotations of a table where the polishing cloth was fixed was 50 rpm. The treatment time was 1.6 minutes.

Then, openings reaching electrodes of the silicon transistor were formed by etching in the silicon oxide film. As the etching, first etching and second etching were performed for 3 seconds and 79 seconds, respectively, by inductively coupled plasma (ICP) etching. The conditions of the first etching were as follows: a mixed atmosphere of trifluoromethane and helium ($CHF_3$:He=50 sccm:100 sccm); a power supply of 475 W; a bias power of 300 W; and a pressure of 5.5 Pa. The second etching was performed after the first etching under the following conditions: a mixed atmosphere of trifluoromethane and helium ($CHF_3$: He=7.5 sccm:142.5 sccm); a power supply of 475 W; a bias power of 300 W; and a pressure of 5.5 Pa. Then, the first etching and the second etching were repeated in this order.

Next, a 150-nm-thick tungsten film to be connection wirings was formed by a sputtering method. The tungsten film was formed using a tungsten target under the following conditions: an argon (Ar=80 sccm) atmosphere; a pressure of 0.8 Pa; a power supply of 1 kW; a distance between the target and the substrate of 60 mm; and a substrate temperature of 230° C.

Then, the tungsten film was etched, whereby the connection wirings were formed. The etching was performed for 5 seconds by ICP etching under the following conditions: a mixed atmosphere of chlorine, carbon tetrafluoride, and oxygen ($Cl_2$: $CF_4$:$O_2$=45 sccm:55 sccm:55 sccm); a power supply of 3000 W; a bias power of 110 W; and a pressure of 0.67 Pa.

Next, a 500-nm-thick silicon oxide film made of TEOS to be an interlayer insulating film was formed by a CVD method.

Then, CMP treatment was performed on the silicon oxide film to expose the connection wirings. The conditions of the CMP treatment were set as follows: polishing pad for CMP was polyurethane-based polishing cloth; slurry was NP8020 (produced by Nitta Haas Incorporated) in undiluted form (a grain size of silica of 60 nm to 80 nm); the slurry temperature was room temperature; the polishing pressure was 0.08 MPa; the number of spindle rotations on a side where the substrate was fixed was 51 rpm; and the number of rotations of a table where the polishing cloth was fixed was 50 rpm. The treatment time was 1.4 minutes.

Next, a 100-nm-thick silicon oxide film made of TEOS, a 50-nm-thick silicon nitride film over the silicon oxide film, and a 300-nm-thick silicon oxide film over the silicon nitride film were formed as an interlayer insulating film by a CVD method.

Then, a 20-nm-thick first oxide semiconductor film and a 15-nm-thick second oxide semiconductor film were stacked. The first oxide semiconductor film was formed by a sputtering method using an oxide target of In:Ga:Zn=1:3:2 (atomic ratio) under the following conditions: a mixed atmosphere of argon and oxygen (Ar:$O_2$=30 sccm:15 sccm); a pressure of 0.4 Pa; a power supply of 0.5 kW; a distance between the substrate and the target of 60 mm; and a substrate temperature of 200° C. The second oxide semiconductor film was formed by a sputtering method using an oxide target of In:Ga:Zn=1:1:1 (atomic ratio) under the following conditions: a mixed atmosphere of argon and oxygen (Ar:$O_2$=30 sccm:15 sccm); a pressure of 0.4 Pa; a power supply of 0.5 kW; a distance between the substrate and the target of 60 mm; and a substrate temperature of 300° C. Note that the first oxide semiconductor film and the second oxide semiconductor film were successively formed without exposure to the air.

Next, heat treatment was performed. The heat treatment was performed under a nitrogen atmosphere at 450° C. for one hour, and then performed under an oxygen atmosphere at 450° C. for one hour.

Then, the first oxide semiconductor film and the second oxide semiconductor film were processed into an island shape by etching. As the etching, ICP etching was performed for 89 seconds under the following conditions: a mixed atmosphere of boron trichloride and chlorine ($BCl_3$:$Cl_2$=60 sccm:20 sccm); a power supply of 450 W; a bias power of 100 W; and a pressure of 1.9 Pa. At the same time, a first blocking film and a second blocking film which have island shapes were formed using the first oxide semiconductor film and the second oxide semiconductor film.

Next, openings reaching the connection wirings were formed by etching in the 100-nm-thick silicon oxide film made of TEOS, the 50-nm-thick silicon nitride film over the silicon oxide film, and the 300-nm-thick silicon oxide film over the silicon nitride film. As the etching, first etching and second etching were performed for 3 seconds and 69 seconds, respectively, by ICP etching. The conditions of the first etching were as follows: a mixed atmosphere of trifluoromethane and helium ($CHF_3$:He=50 sccm:100 sccm); a power supply of 475 W; a bias power of 300 W; and a pressure of 5.5 Pa. The second etching was performed after the first etching under the following conditions: a mixed atmosphere of trifluoromethane and helium ($CHF_3$:He=7.5 sccm:142.5 sccm); a power supply of 475 W; a bias power of 300 W; and a pressure of 5.5 Pa. Then, the first etching and the second etching were repeated in this order.

Next, a 100-nm-thick tungsten film to be a source electrode and a drain electrode was formed. The tungsten layer was formed by a sputtering method using a tungsten target under the following conditions: an argon (Ar=80 sccm) atmosphere; a pressure of 0.8 Pa; a power supply (power supply output) of 1.0 kW; a distance between the substrate and the target of 60 mm; and a substrate temperature of 230° C.

Then, a resist mask was formed over the tungsten film and etching was performed. As the etching, first etching, second etching, and third etching were performed for 13 seconds, 15 seconds, and 14 seconds, respectively, by ICP etching. The conditions of the first etching were as follows: a mixed atmosphere of carbon tetrafluoride, chlorine, and oxygen ($CF_4$:$Cl_2$:$O_2$=55 sccm:45 sccm:55 sccm); a power supply of 3000 W; a bias power of 110 W; and a pressure of 0.67 Pa. The second etching was performed after the first etching under the following conditions: an oxygen atmosphere ($O_2$=100 sccm); a power supply of 2000 W; a bias power of 0 W; and a pressure of 3.0 Pa. The third etching was performed after the second etching under the following conditions: a mixed atmosphere of carbon tetrafluoride, chlorine, and oxygen ($CF_4$:$Cl_2$:$O_2$=55 sccm:45 sccm:55 sccm); a power supply of 3000 W; a bias power of 110 W; and a pressure of 0.67 Pa. Thus, the source electrode and the drain electrode were formed.

Next, a 5-nm-thick third oxide semiconductor film was formed over the second oxide semiconductor film, the source electrode, and the drain electrode. The third oxide semiconductor film was formed by a sputtering method using an oxide target of In:Ga:Zn=1:3:2 (atomic ratio) under the following conditions: a mixed atmosphere of argon and oxygen (Ar:$O_2$=30 sccm:15 sccm); a pressure of 0.4 Pa; a power supply of 0.5 kW; a distance between the target and the substrate of 60 mm; and a substrate temperature of 200° C.

After that, a 20-nm-thick silicon oxynitride film to be a gate insulating film was formed by a CVD method under the following conditions: a mixed atmosphere of silane and dinitrogen monoxide ($SiH_4$:$N_2O$=1 sccm:800 sccm); a pressure of 200 Pa, a power supply of 150 kW; a distance between the target and the substrate of 28 mm; and a substrate temperature of 350° C.

Next, a 30-nm-thick titanium nitride film and a 135-nm-thick tungsten film were formed by a sputtering method. The deposition conditions of the titanium nitride film were as follows: a nitrogen ($N_2$=50 sccm) atmosphere; a pressure of 0.2 Pa; a power supply of 12 kW; a distance between the target and the substrate of 400 mm; and a substrate temperature of 25° C. The deposition conditions of the tungsten film were as follows: an argon (Ar=100 sccm) atmosphere; a pressure of 2.0 Pa; a power supply of 4 kW; a distance between the target and the substrate of 60 mm; and a substrate temperature of 230° C.

The stack of the 30-nm-thick titanium nitride film and the 135-nm-thick tungsten film was etched by ICP etching. As the etching, first etching and second etching were performed. The conditions of the first etching were as follows: a mixed atmosphere of chlorine, carbon tetrafluoride, and oxygen ($Cl_2$:$CF_4$:$O_2$=45 sccm:55 sccm:55 sccm); a power supply of 3000 W; a bias power of 110 W; and a pressure of 0.67 Pa. The second etching was performed after the first etching under the following conditions: a mixed atmosphere of chlorine and boron trichloride ($Cl_2$:$BCl_3$=50 sccm:150 sccm); a power supply of 1000 W; a bias power of 50 W; and a pressure of 0.67 Pa. Thus, a gate electrode was formed.

Next, a stack of the gate insulating film and the third oxide semiconductor film was etched using the gate electrode as a mask. The etching was performed under the following conditions: a boron trichloride ($BCl_3$=80 sccm) atmosphere; a power supply of 450 W; a bias power of 100 W; and a pressure of 1.0 Pa.

Then, a 150-nm-thick aluminum oxide film was formed over the gate electrode by a sputtering method under the following conditions: a mixed atmosphere of argon and oxygen (Ar:$O_2$=25 sccm:25 sccm); a pressure of 0.4 Pa; a power supply of 2.5 kW; a distance between the target and the substrate of 60 mm; and a substrate temperature of 250° C.

Through the above process, an example transistor with a channel length of 0.8 μm and a channel width of 10 μm was formed. In addition, as a comparative example, a transistor having the same structure as the above transistor except that the first blocking film and the second blocking film are not provided was formed.

Figure 18A:
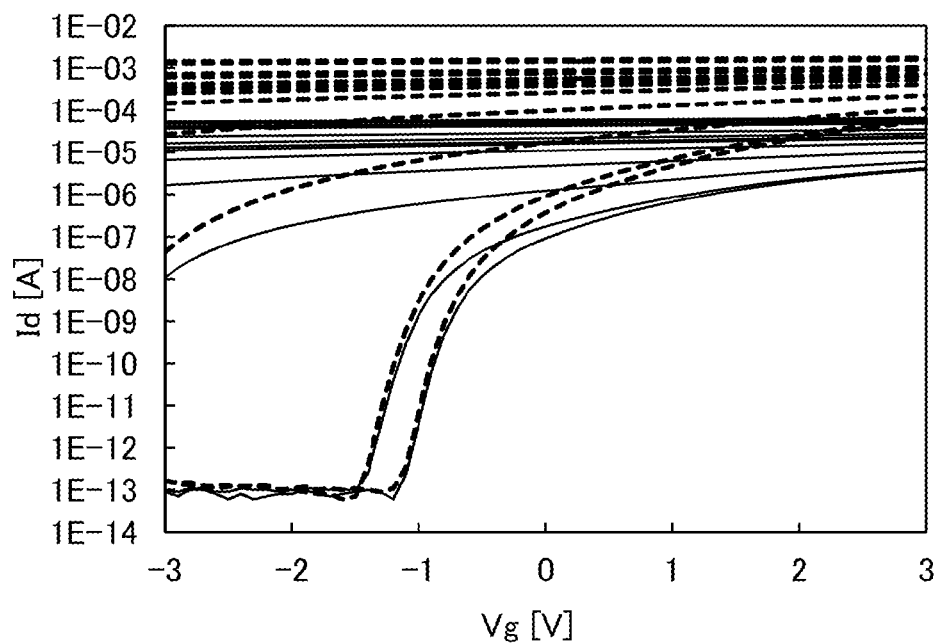
FIGS. 18A and 18B each show characteristics of a transistor in an example.
Figure 18B:
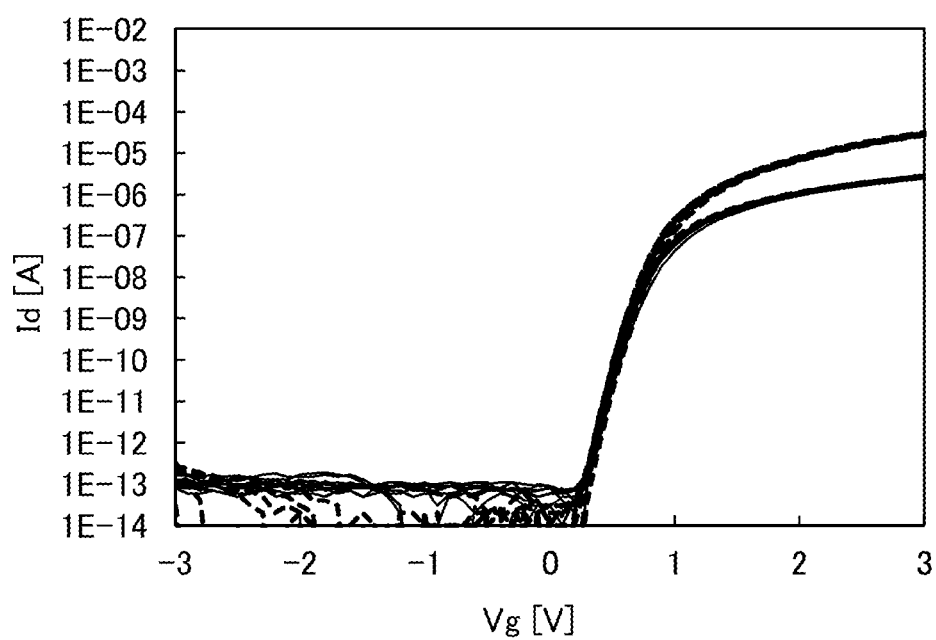

Next, in the formed two transistors, a drain current ($I_d$: [A]) was measured under the conditions where a drain voltage ($V_d$: [V]) was set to 0.1 V or 2.7 V and a gate voltage ($V_g$: [V]) was swept from −3 V to 3 V. FIGS. 18A and 18B show measurement results. In FIGS. 18A and 18B, the solid line represents the measurement results at a drain voltage ($V_d$: [V]) of 0.1 V, the dotted line represents the measurement results at a drain voltage ($V_d$: [V]) of 2.7 V, the horizontal axis represents the gate voltage ($V_g$: [V]), and the vertical axis represents the drain current ($I_d$: [A]). Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential. FIG. 18A shows the measurement results of the comparative transistor, and FIG. 18B shows the measurement results of the example transistor.

FIG. 18A shows a large variation in characteristics. On the other hand, FIG. 18B shows a small variation in characteristics. The results suggest that providing the blocking films makes it possible to reduce variation in characteristics.

This application is based on Japanese Patent Application serial no. 2013-184560 filed with Japan Patent Office on Sep. 6, 2013, the entire contents of which are hereby incorporated by reference.

What is claimed is:

1. A semiconductor device comprising:
an oxide semiconductor film and a blocking film;
a source electrode and a drain electrode electrically connected to the oxide semiconductor film; and
a gate electrode overlapping with the oxide semiconductor film with a gate insulating film interposed therebetween,
wherein the blocking film contains the same material as the oxide semiconductor film, is on the same surface as the oxide semiconductor film, and has a higher conductivity than the oxide semiconductor film,
wherein the oxide semiconductor film and the blocking film are not in contact with each other.

2. The semiconductor device according to claim 1, wherein the oxide semiconductor film has a stacked structure.

3. The semiconductor device according to claim 1, wherein the blocking film surrounds the oxide semiconductor film.

4. The semiconductor device according to claim 1, wherein the blocking film has higher hydrogen concentration than the oxide semiconductor film.

5. The semiconductor device according to claim 1, further comprising:
an insulating film over the oxide semiconductor film, the blocking film, the source electrode and the drain electrode, the insulating film having an opening; and
a conductive film over the insulating film, the conductive film being electrically connected to one of the source electrode and the drain electrode through the opening of the insulating film,
wherein the blocking film is between the oxide semiconductor film and the opening of the insulating film.

6. A semiconductor device comprising:
an insulating film over a conductive film, the insulating film having an opening;
an oxide semiconductor film over the insulating film;
a blocking film on the same surface as the oxide semiconductor film; and
a source electrode and a drain electrode electrically connected to the oxide semiconductor film,
wherein one of the source electrode and the drain electrode is electrically connected to the conductive film through the opening of the insulating film, and
wherein the blocking film is between the oxide semiconductor film and the opening of the insulating film.

7. The semiconductor device according to claim 6, wherein the oxide semiconductor film has a stacked structure.

8. The semiconductor device according to claim 6, wherein the blocking film surrounds the oxide semiconductor film.

9. The semiconductor device according to claim 6,
wherein the blocking film contains the same material as the oxide semiconductor film, and
wherein the blocking film has a higher conductivity than the oxide semiconductor film.

10. The semiconductor device according to claim 6, wherein the blocking film has higher hydrogen concentration than the oxide semiconductor film.

11. The semiconductor device according to claim 6, further comprising:
a gate electrode overlapping with the oxide semiconductor film with a gate insulating film interposed therebetween.

12. A semiconductor device comprising:
a transistor comprising a semiconductor material;
an interlayer insulating film over the transistor;
a conductive film over the interlayer insulating film, the conductive film being electrically connected to the transistor;
an insulating film over the conductive film, the insulating film having an opening;
an oxide semiconductor film over the insulating film;
a blocking film on the same surface as the oxide semiconductor film; and
a source electrode and a drain electrode electrically connected to the oxide semiconductor film,
wherein one of the source electrode and the drain electrode is electrically connected to the conductive film through the opening of the insulating film, and
wherein the blocking film is between the oxide semiconductor film and the opening of the insulating film.

13. The semiconductor device according to claim 12, wherein the oxide semiconductor film has a stacked structure.

14. The semiconductor device according to claim 12, wherein the blocking film surrounds the oxide semiconductor film.

15. The semiconductor device according to claim 12,
   wherein the blocking film contains the same material as the oxide semiconductor film, and
   wherein the blocking film has a higher conductivity than the oxide semiconductor film.

16. The semiconductor device according to claim 12, wherein the blocking film has higher hydrogen concentration than the oxide semiconductor film.

17. The semiconductor device according to claim 12, further comprising:
   a gate electrode overlapping with the oxide semiconductor film with a gate insulating film interposed therebetween.

* * * * *